US010707193B2

(12) United States Patent
Tsukiyama et al.

(10) Patent No.: US 10,707,193 B2
(45) Date of Patent: Jul. 7, 2020

(54) SEMICONDUCTOR DEVICE PACKAGE HAVING A MOUNTING PLATE WITH PROTRUSIONS EXPOSED FROM A RESIN MATERIAL

(71) Applicant: TOSHIBA MEMORY CORPORATION, Tokyo (JP)

(72) Inventors: Satoshi Tsukiyama, Yokohama Kanagawa (JP); Hideo Aoki, Yokohama Kanagawa (JP); Yoshiaki Goto, Kiyosu Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,428

(22) Filed: Mar. 1, 2018

(65) Prior Publication Data

US 2019/0088632 A1    Mar. 21, 2019

(30) Foreign Application Priority Data

Sep. 19, 2017  (JP) ................. 2017-179329

(51) Int. Cl.
*H01L 25/16* (2006.01)
*H01L 25/00* (2006.01)
(Continued)

(52) U.S. Cl.
CPC ........ *H01L 25/165* (2013.01); *H01L 21/4842* (2013.01); *H01L 21/561* (2013.01);
(Continued)

(58) Field of Classification Search
CPC ....... H01L 23/49503–49513; H01L 23/49541; H01L 23/49561; H01L 23/49565; H01L 23/49568; H01L 23/49575; H01L 23/13; H01L 23/149; H01L 23/367; H01L 25/0657; H01L 23/495–49586; H01L 25/074; H01L 25/0756; H01L 25/043;
(Continued)

(56) References Cited

U.S. PATENT DOCUMENTS 8,941,233 B1 * 1/2015 Ngai ...................... H01L 25/50
257/712
9,209,154 B2  12/2015 Lin et al.
(Continued)

FOREIGN PATENT DOCUMENTS

JP  2012-44168 A  3/2012
JP  2012-64282 A  3/2012
(Continued)

*Primary Examiner* — Younes Boulghassoul
(74) *Attorney, Agent, or Firm* — Kim & Stewart LLP

(57) ABSTRACT

According to one embodiment, a semiconductor device of an embodiment includes a substrate, a metal plate having a main portion having a first width in a first direction and a second width in a second direction orthogonal to the first direction, a first semiconductor chip located between the metal plate and the substrate, the first semiconductor chip having a third width in the first direction and a fourth width in the second direction, and a second semiconductor chip located between the first semiconductor chip and the substrate, wherein the first width is smaller than the third width, and the second width is smaller than the fourth width.

18 Claims, 19 Drawing Sheets

(51) Int. Cl.
*H01L 23/14* (2006.01)
*H01L 23/00* (2006.01)
*H01L 23/495* (2006.01)
*H01L 25/065* (2006.01)
*H01L 23/31* (2006.01)
*H01L 21/48* (2006.01)
*H01L 21/56* (2006.01)
*H01L 21/78* (2006.01)

(52) U.S. Cl.
CPC ............ *H01L 21/565* (2013.01); *H01L 21/78* (2013.01); *H01L 23/142* (2013.01); *H01L 23/49541* (2013.01); *H01L 24/32* (2013.01); *H01L 24/97* (2013.01); *H01L 25/0657* (2013.01); *H01L 25/50* (2013.01); *H01L 23/3128* (2013.01); *H01L 23/49575* (2013.01); *H01L 24/16* (2013.01); *H01L 24/17* (2013.01); *H01L 24/73* (2013.01); *H01L 2224/16145* (2013.01); *H01L 2224/16227* (2013.01); *H01L 2224/171* (2013.01); *H01L 2224/1703* (2013.01); *H01L 2224/17181* (2013.01); *H01L 2224/2919* (2013.01); *H01L 2224/32245* (2013.01); *H01L 2224/73253* (2013.01); *H01L 2225/06513* (2013.01); *H01L 2225/06517* (2013.01); *H01L 2225/06565* (2013.01); *H01L 2225/06568* (2013.01); *H01L 2225/06586* (2013.01); *H01L 2924/1431* (2013.01); *H01L 2924/1438* (2013.01); *H01L 2924/14511* (2013.01); *H01L 2924/3512* (2013.01)

(58) Field of Classification Search
CPC ..... H01L 25/117; H01L 24/97; H01L 23/142; H01L 23/3675; H01L 25/50; H01L 21/56–565; H01L 23/31–3192
See application file for complete search history.

(56) References Cited

U.S. PATENT DOCUMENTS

| | | |
|---|---|---|
| 9,252,062 B2 | 2/2016 | Ide et al. |
| 2006/0091527 A1* | 5/2006 | Tsai .................... H01L 23/3128 257/706 |
| 2006/0113663 A1* | 6/2006 | Yuan .................... H01L 23/4334 257/718 |
| 2010/0001410 A1* | 1/2010 | Kang .................... H01L 21/565 257/778 |
| 2010/0084758 A1* | 4/2010 | Mun ....................... H01L 23/16 257/690 |
| 2011/0089573 A1* | 4/2011 | Kurita ................. H01L 23/3121 257/774 |
| 2012/0018869 A1* | 1/2012 | Kolan ..................... H01L 23/24 257/690 |
| 2012/0038045 A1 | 2/2012 | Lee |
| 2012/0168936 A1 | 7/2012 | Huang et al. |
| 2012/0171814 A1* | 7/2012 | Choi ..................... H01L 21/561 438/107 |
| 2014/0312480 A1* | 10/2014 | Gong .................. H01L 23/3114 257/675 |
| 2015/0069596 A1* | 3/2015 | Kawasaki ............. H01L 23/367 257/712 |
| 2015/0132950 A1 | 5/2015 | Jung et al. |
| 2015/0371971 A1* | 12/2015 | Yokoyama .......... H01L 23/3128 257/738 |
| 2016/0260687 A1* | 9/2016 | Gao ........................ H01L 24/81 |
| 2016/0365340 A1* | 12/2016 | Tajima .................... H01L 24/19 |
| 2017/0194268 A1* | 7/2017 | Ho ........................ H01L 21/4853 |
| 2017/0263582 A1* | 9/2017 | Maeda ................ H01L 25/0657 |
| 2018/0108592 A1* | 4/2018 | Hembree .............. H01L 23/367 |
| 2019/0393114 A1* | 12/2019 | Tsukiyama ............. H01L 24/09 |

FOREIGN PATENT DOCUMENTS

| | | |
|---|---|---|
| TW | 201227916 A | 7/2012 |
| TW | 201503315 A | 1/2015 |
| TW | 201523834 A | 6/2015 |
| TW | 201701418 A | 1/2017 |

* cited by examiner

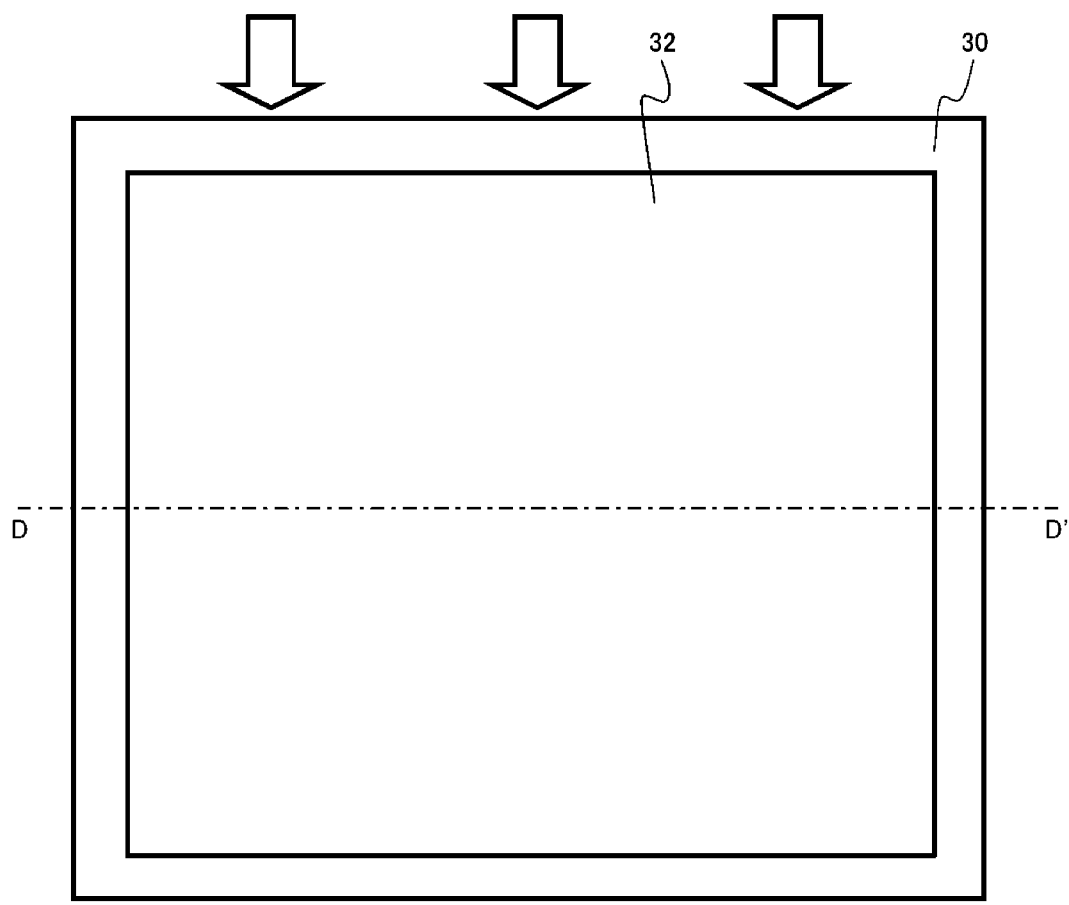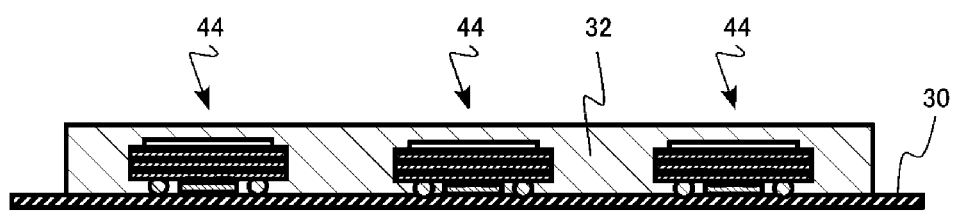

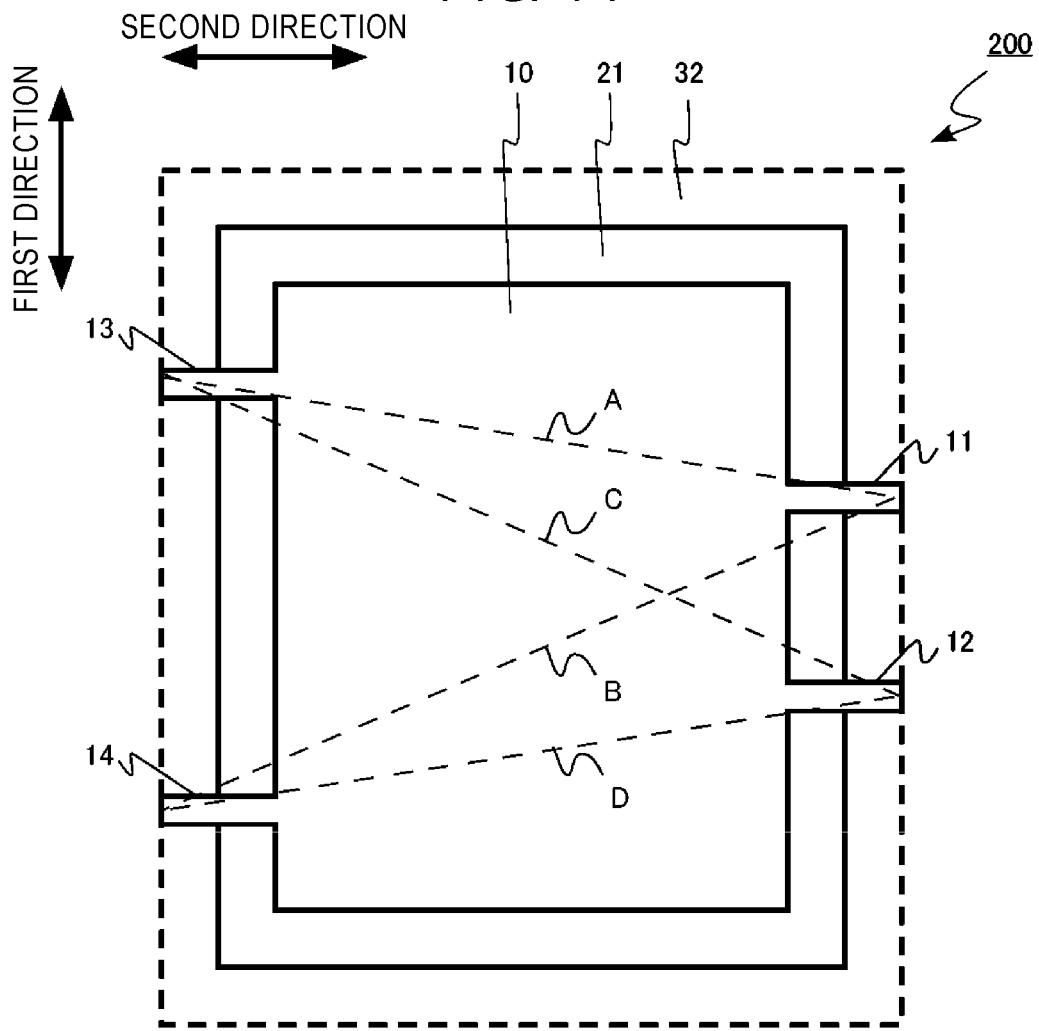

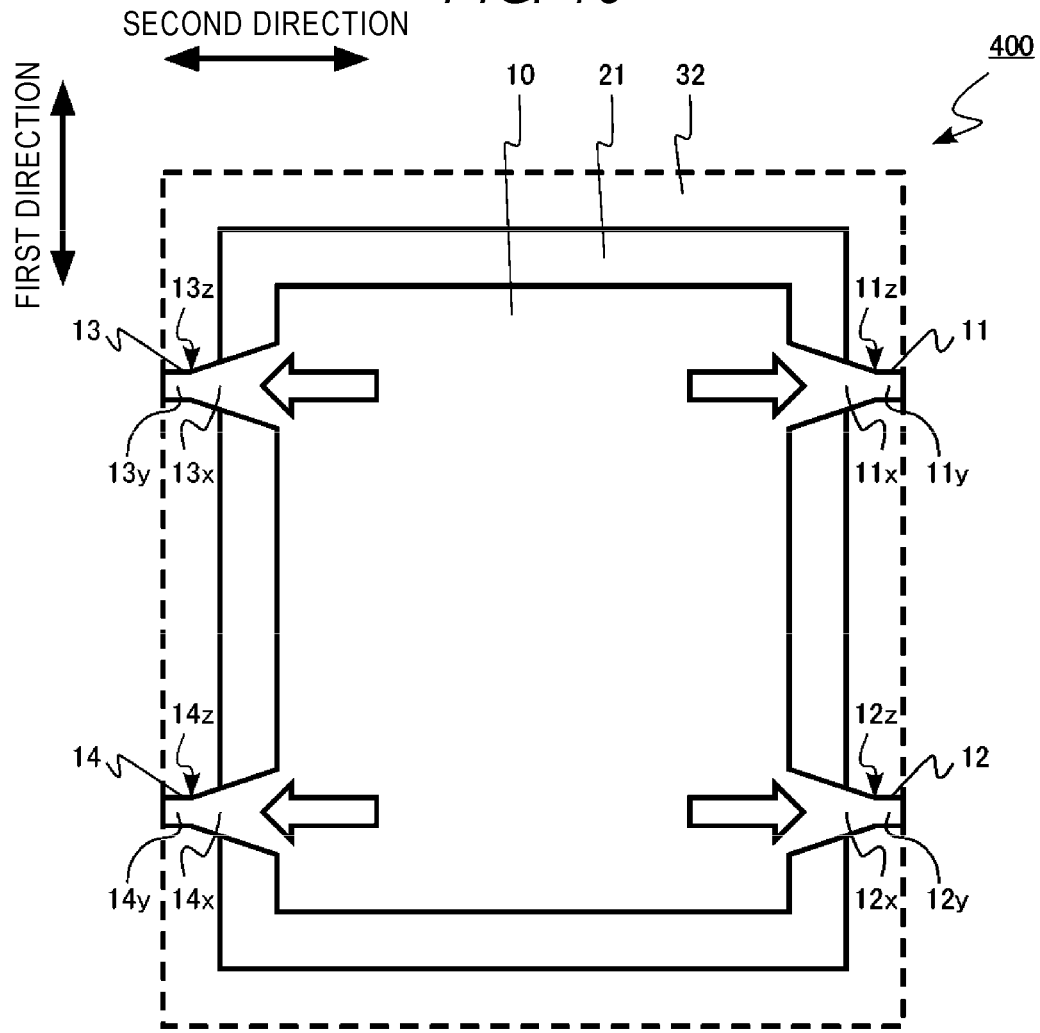

SEMICONDUCTOR DEVICE PACKAGE HAVING A MOUNTING PLATE WITH PROTRUSIONS EXPOSED FROM A RESIN MATERIAL

CROSS-REFERENCE TO RELATED APPLICATION

This application is based upon and claims the benefit of priority from Japanese Patent Application No. 2017-179329, filed Sep. 19, 2017, the entire contents of which are incorporated herein by reference.

FIELD

Embodiments described herein relate generally to a semiconductor device.

BACKGROUND

There is a semiconductor package made by stacking together multiple semiconductor chips and sealing the stack of semiconductor chips with a resin. It is possible to increase the capacity and speed of a semiconductor device and reduce the power consumption thereof by stacking the multiple semiconductor chips and accommodating the semiconductor chips in a single semiconductor package. In order to decrease the size of an electronic apparatus in which the semiconductor package is mounted, it is required to decrease the size of the semiconductor package.

DESCRIPTION OF THE DRAWINGS

FIGS. 8A and 8B are schematic views illustrating the method of manufacturing the semiconductor device of the first embodiment.
FIG. 14 is a schematic top plan view of a semiconductor device of a second embodiment.
FIG. 19 is a schematic top plan view of a semiconductor device of a fourth embodiment.

DETAILED DESCRIPTION

Figure 1A:
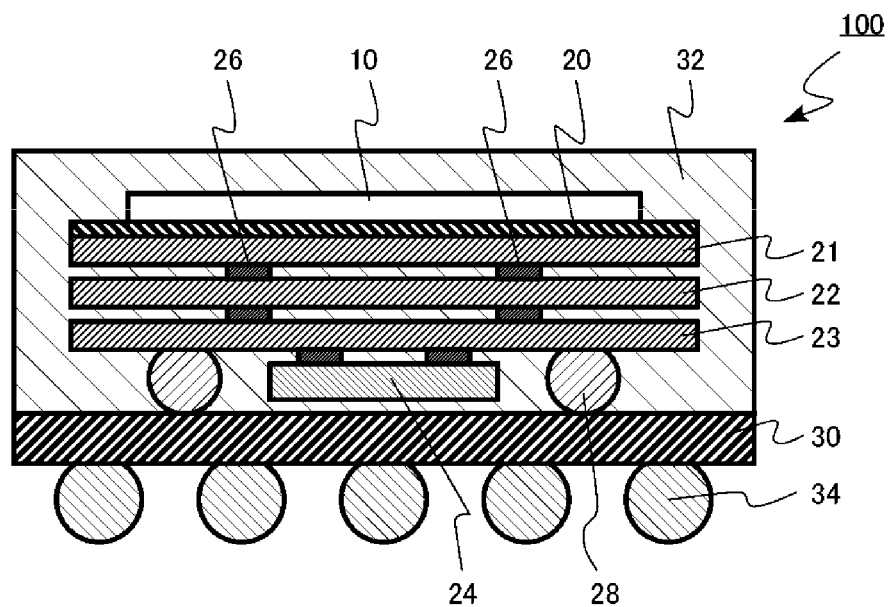
FIGS. 1A and 1B are schematic cross-sectional views of a semiconductor device of a first embodiment.

Embodiments provide a semiconductor device capable of being miniaturized.

In general, according to one embodiment, a semiconductor device includes a substrate, a metal plate having a main portion having a first width in a first direction and a second width in a second direction orthogonal to the first direction, a first semiconductor chip located between the metal plate and the substrate, the first semiconductor chip having a third width in the first direction and a fourth width in the second direction, and a second semiconductor chip located between the first semiconductor chip and the substrate, wherein the first width is smaller than the third width, and the second width is smaller than the fourth width.

Hereinafter, embodiments of the present disclosure will be described with reference to the drawings. Further, in the following description, the same or similar members are designated by the same reference numerals, and once a member is described, a description of the member will be omitted appropriately.

In the present specification, the term "upper" or "lower" is used for convenience. The term "upper" or "lower" just indicates a relative positional relationship in the drawings, and does not indicate a positional relationship related to gravity.

Hereinafter, a semiconductor device according to an embodiment will be described with reference to the drawings.

First Embodiment

A semiconductor device of a first embodiment includes a substrate, a metal plate having a first width in a first direction and a second width in a second direction orthogonal to the first direction, a first semiconductor chip provided between the metal plate and the substrate and having a third width in the first direction and a fourth width in the second direction, and a second semiconductor chip provided between the first semiconductor chip and the substrate, in which the first width is smaller than the third width and the second width is smaller than the fourth width.

Figure 1B:
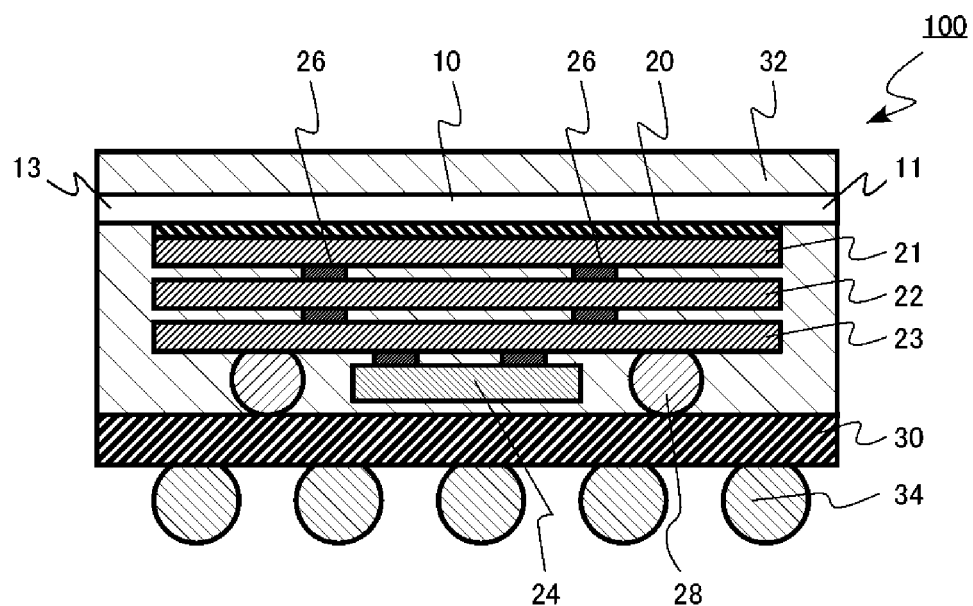
Figure 2:
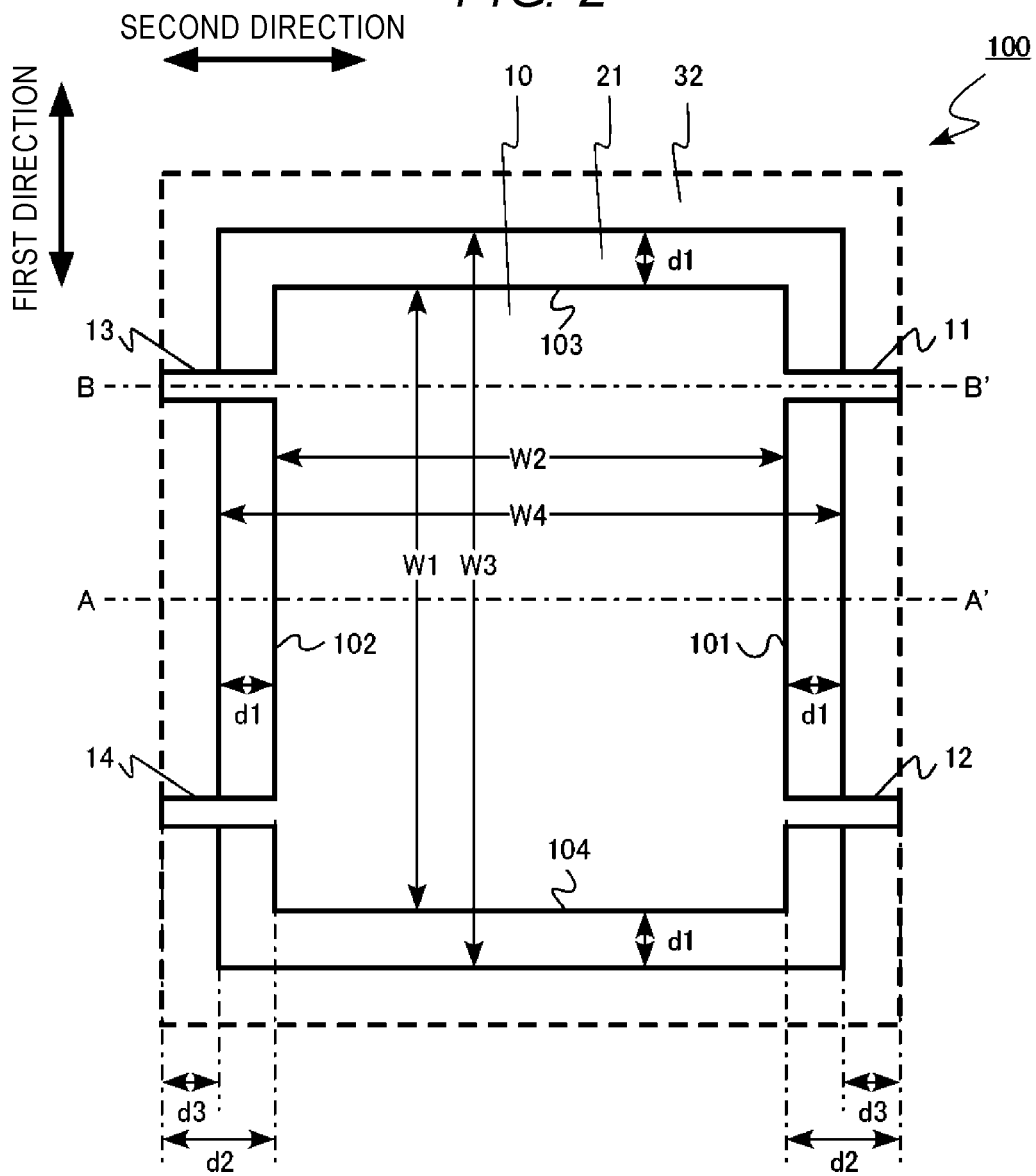
FIG. 2 is a schematic top plan view of the semiconductor device of the first embodiment.
Figure 3:
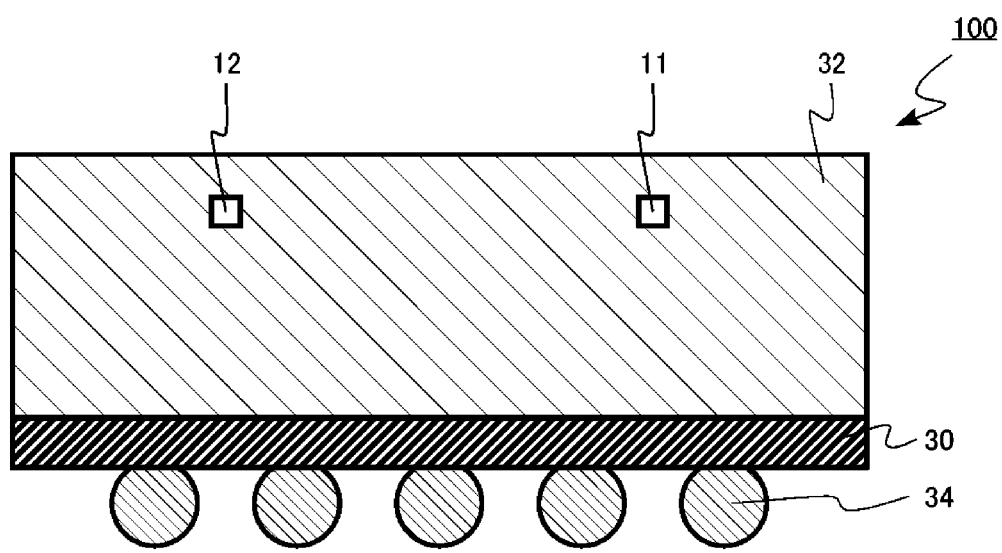
FIG. 3 is a schematic side view of the semiconductor device of the first embodiment.

FIGS. 1A and 1B are schematic cross-sectional views of the semiconductor device of the first embodiment. FIG. 2 is a schematic top plan view of the semiconductor device of the first embodiment. FIG. 3 is a schematic side view of the semiconductor device of the first embodiment. FIG. 1A is a cross-sectional view taken along line A-A' in FIG. 2. FIG. 1B is a cross-sectional view taken along line B-B' in FIG. 2. FIG. 2 is a view viewed through mold resin, i.e., as though the resin were not present.

The semiconductor device of the first embodiment is a semiconductor memory 100. In the semiconductor memory 100, multiple memory chips and multiple logic chips are mounted in a single package.

The semiconductor memory 100 includes a metal bed 10 (metal plate), a resin layer 20, a first memory chip 21 (first semiconductor chip), a second memory chip 22 (second semiconductor chip), a third memory chip 23, a logic chip 24, connecting portions 26, connecting terminals 28, a circuit board 30 (substrate), mold resin 32 (resin material), and external terminals 34.

The metal bed 10 has a flat plate shape. The metal bed 10 has a first side 101, a second side 102, a third side 103, and a fourth side 104. The first side 101 and the second side 102 are in parallel with each other in the first direction and are opposite to each other. The third side 103 and the fourth side 104 are in parallel with each other in the second direction and are opposite to each other. The first direction and the second direction are orthogonal to each other.

The width of the metal bed 10 in the first direction is a first width (W1 in FIG. 2). The width of the metal bed 10 in the second direction is a second width (W2 in FIG. 2). A width of the first memory chip 21 in the first direction is a third width (W3 in FIG. 2). The width of the first memory chip 21 in the second direction is a fourth width (W4 in FIG. 2). The first width W1 is smaller than the third width W3, and the second width W2 is smaller than the fourth width W4.

The size of the metal bed 10 is smaller than the size of the first memory chip 21. The area of the metal bed 10 is smaller than the area of the first memory chip 21. The distance (d1 in FIG. 2) between an end portion of the metal bed 10 and an end portion of the first memory chip 21 is, for example, 50 µm or more and 500 µm or less.

The metal bed 10 has a first protruding portion 11, a second protruding portion 12, a third protruding portion 13, and a fourth protruding portion 14. The first protruding portion 11 and the second protruding portion 12 are provided on the first side 101 of the metal bed 10. The third protruding portion 13 and the fourth protruding portion 14 are provided on the second side 102 of the metal bed 10. The first protruding portion 11, the second protruding portion 12, the third protruding portion 13, and the fourth protruding portion 14 extend from the main portion of the metal bed 10 in the second direction.

The length (d2 in FIG. 2) of each of the first protruding portion 11, the second protruding portion 12, the third protruding portion 13, and the fourth protruding portion 14 is, for example, 0.5 mm or more and 1.5 mm or less. The distance (d3 in FIG. 2) between an end portion of the first memory chip 21 and a tip end of each of the first protruding portion 11, the second protruding portion 12, the third protruding portion 13, and the fourth protruding portion 14 is, for example, 0.4 mm or more and 1.0 mm or less.

The width of each of the first protruding portion 11, the second protruding portion 12, the third protruding portion 13, and the fourth protruding portion 14 is nearly uniform. The width of each of the first protruding portion 11, the second protruding portion 12, the third protruding portion 13, and the fourth protruding portion 14 is, for example, 0.2 mm or more and 0.4 mm or less.

As illustrated in FIG. 3, the ends of the first protruding portion 11 and the second protruding portion 12 are exposed at side surfaces of the mold resin 32. The tip end of the first protruding portion 11 and the tip end of the second protruding portion 12 are exposed at side surface of the mold resin 32. Similarly, the third protruding portion 13 and the fourth protruding portion 14 are exposed at an opposed side surface of the mold resin 32. The tip end of the third protruding portion 13 and the tip end of the fourth protruding portion 14 are exposed at the side surface of the mold resin 32.

The film thickness of the metal bed 10 is, for example, 100 µm or more and 200 µm or less. The metal bed 10 is made of, for example, an alloy of iron and nickel. The metal bed is, for example, a 42 alloy.

The metal bed 10 is a part of a lead frame used when packaging the semiconductor memory 100. When packaging the semiconductor memory 100, the metal bed 10 serves to support the first memory chip 21, the second memory chip 22, the third memory chip 23, and the logic chip 24 which form a stack.

Each of the first protruding portion 11, the second protruding portion 12, the third protruding portion 13, and the fourth protruding portion 14 is a part of a suspension pin provided on the lead frame used when packaging the semiconductor memory 100. Each of the first protruding portion 11, the second protruding portion 12, the third protruding portion 13, and the fourth protruding portion 14 is a suspension pin that is cut during dicing.

An uneven portion may be provided on one surface or both surfaces of the metal bed 10 in order to improve adhesion between the metal bed 10 and the resin layer 20 or adhesion between the metal bed 10 and the mold resin 32. The uneven portion includes, for example, multiple bottomed holes, i.e., blind holes that do not penetrate through the metal bed 10. In addition, the uneven portion may include, for example, multiple through via holes.

The resin layer 20 is formed between the metal bed 10 and the first memory chip 21. The resin layer 20 is, for example, a thermosetting resin. The resin layer 20 is, for example, a die attachment film (DAF). The resin layer 20 serves to bond the metal bed 10 and the first memory chip 21 to each other.

The first memory chip 21, the second memory chip 22, the third memory chip 23, and the logic chip 24 are provided between the metal bed 10 and the circuit board 30. The third memory chip 23, the second memory chip 22, and the first memory chip 21 are stacked on the logic chip 24.

The connecting portions 26 are provided between the logic chip 24, the third memory chip 23, the second memory chip 22, and the first memory chip 21. The logic chip 24, the third memory chip 23, the second memory chip 22, and the first memory chip 21 are electrically connected to one another using the connecting portions 26. The connecting portions 26 are, for example, micro bumps.

The thickness of each of the first memory chip 21, the second memory chip 22, and the third memory chip 23 is, for example, 30 µm or more and 50 µm or less. The interval between the first memory chip 21 and the second memory chip 22 and the interval between the second memory chip 22 and the third memory chip 23 are, for example, 10 µm or more and 30 µm or less.

The first memory chip 21, the second memory chip 22, and the third memory chip 23 serve to store data. Each of the first memory chip 21, the second memory chip 22, and the third memory chip 23 is, for example, a NAND type flash memory. The first memory chip 21, the second memory chip 22, and the third memory chip 23 are manufactured using, for example, monocrystalline silicon.

The logic chip 24 is provided with a calculation function. The logic chip 24 is, for example, a controller chip for the first memory chip 21, the second memory chip 22, and the third memory chip 23.

The circuit board 30 is provided below the first memory chip 21, the second memory chip 22, the third memory chip 23, and the logic chip 24. The circuit board 30 is a glass epoxy substrate. The circuit board 30 serves to electrically connect the first memory chip 21, the second memory chip 22, the third memory chip 23, and the logic chip 24 to an external electronic circuit.

The connecting terminals 28 are provided between the third memory chip 23 and the circuit board 30. The third memory chip 23 and the circuit board 30 are electrically connected to each other by the connecting terminals 28. The connecting terminals 28 are, for example, micro bumps.

The external terminals 34 are provided below the circuit board 30. The external terminals 34 are, for example, solder balls.

The mold resin 32 covers the metal bed 10, the first memory chip 21, the second memory chip 22, the third memory chip 23, and the logic chip 24. The mold resin 32 is also provided between the first memory chip 21 and the second memory chip 22, between the second memory chip 22 and the third memory chip 23, and between the third memory chip 23 and the logic chip 24.

The mold resin 32 serves to protect the first memory chip 21, the second memory chip 22, the third memory chip 23, and the logic chip 24. The main component of the mold resin 32 is, for example, epoxy resin.

Next, a method of manufacturing the semiconductor device of the first embodiment will be described. A method of packaging the semiconductor memory 100 will be described.

Figure 4A:
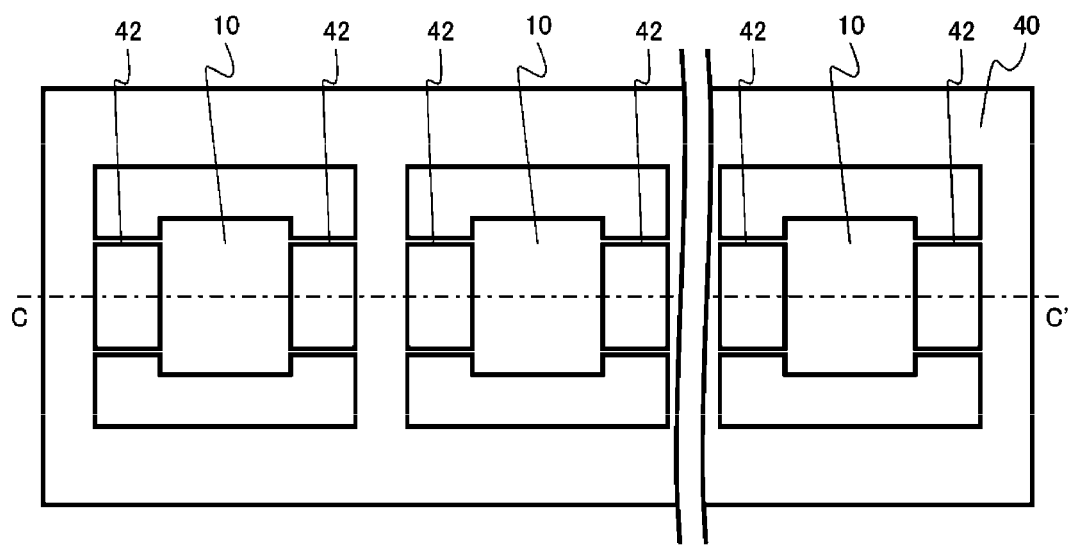
FIGS. 4A and 4B are schematic views illustrating a method of manufacturing the semiconductor device of the first embodiment.
Figure 4B:
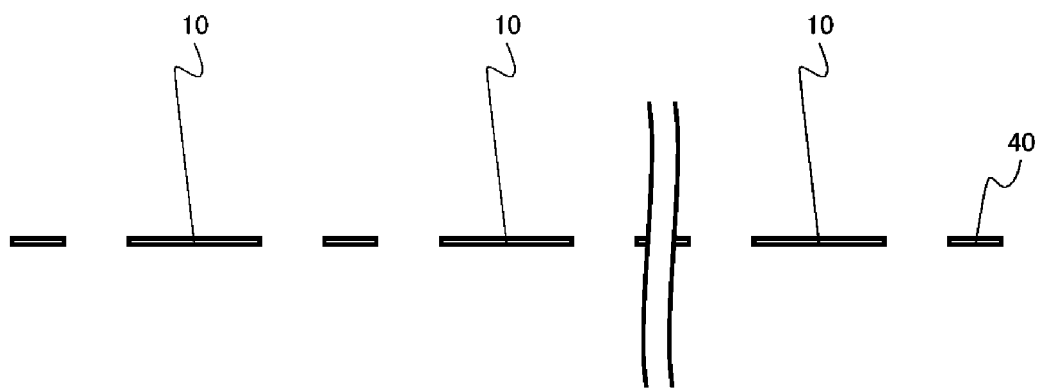
Figure 5A:
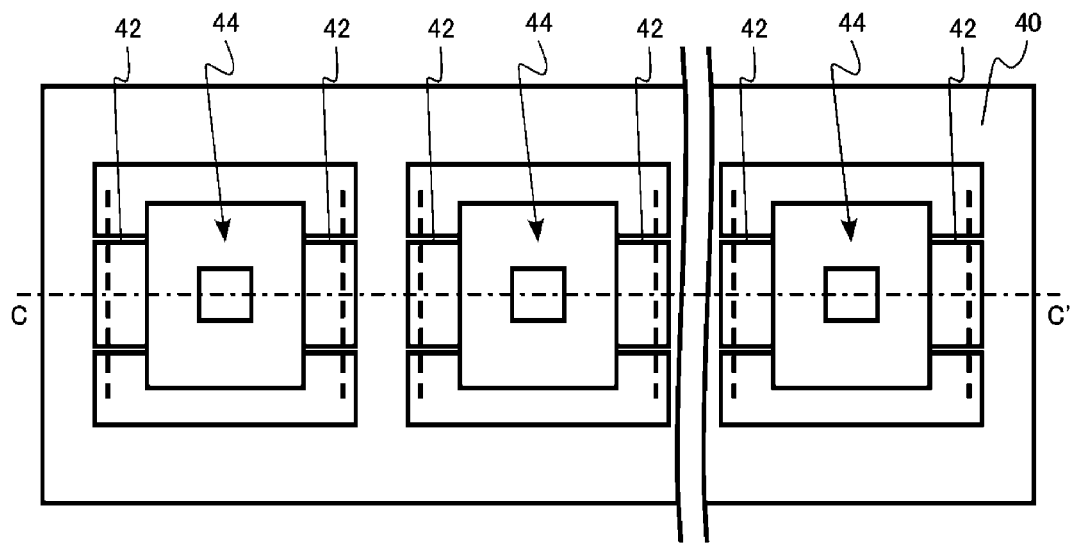
FIGS. 5A and 5B are schematic views illustrating a method of manufacturing the semiconductor device of the first embodiment.
Figure 5B:
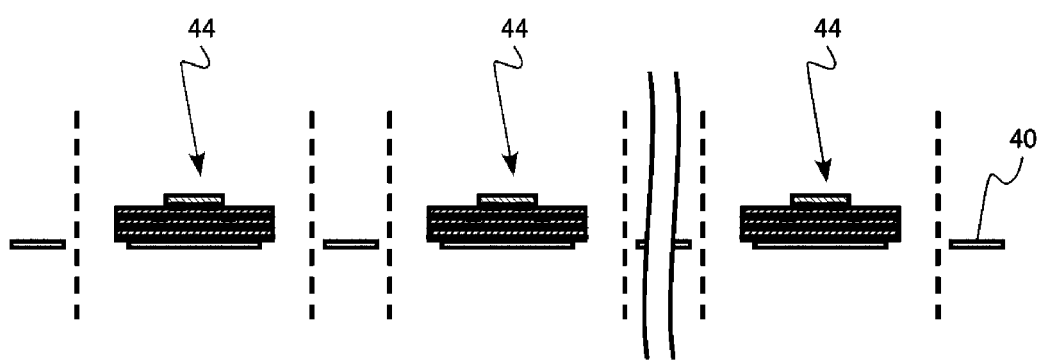

FIGS. 4A and 4B and FIGS. 5A and 5B are schematic views illustrating the method of manufacturing the semiconductor device of the first embodiment. FIGS. 4A and 5A are top plan views. FIG. 4B is a cross-sectional view taken along line C-C' in FIG. 4A. FIG. 5B is a cross-sectional view taken along line C-C' in FIG. 5A.

First, a lead frame 40 is provided (FIGS. 4A and 4B). The multiple metal beds 10 are provided as a part of the lead frame 40. The metal beds 10 are supported in space and to one another by the suspension pins 42.

Next, a stacked body 44 is formed by stacking the multiple semiconductor chips on the metal bed 10 (FIGS. 5A and 5B). The stacked body 44 is provided with the metal bed 10, the resin layer 20, the first memory chip 21, the second memory chip 22, the third memory chip 23, the logic chip 24, and the connecting portions 26.

The multiple semiconductor chips of the stacked body 44 are bonded to the metal bed 10 by the resin layer 20. In addition, the multiple semiconductor chips of the stacked body 44 are connected to one another by using, for example, micro bumps.

Figure 6A:
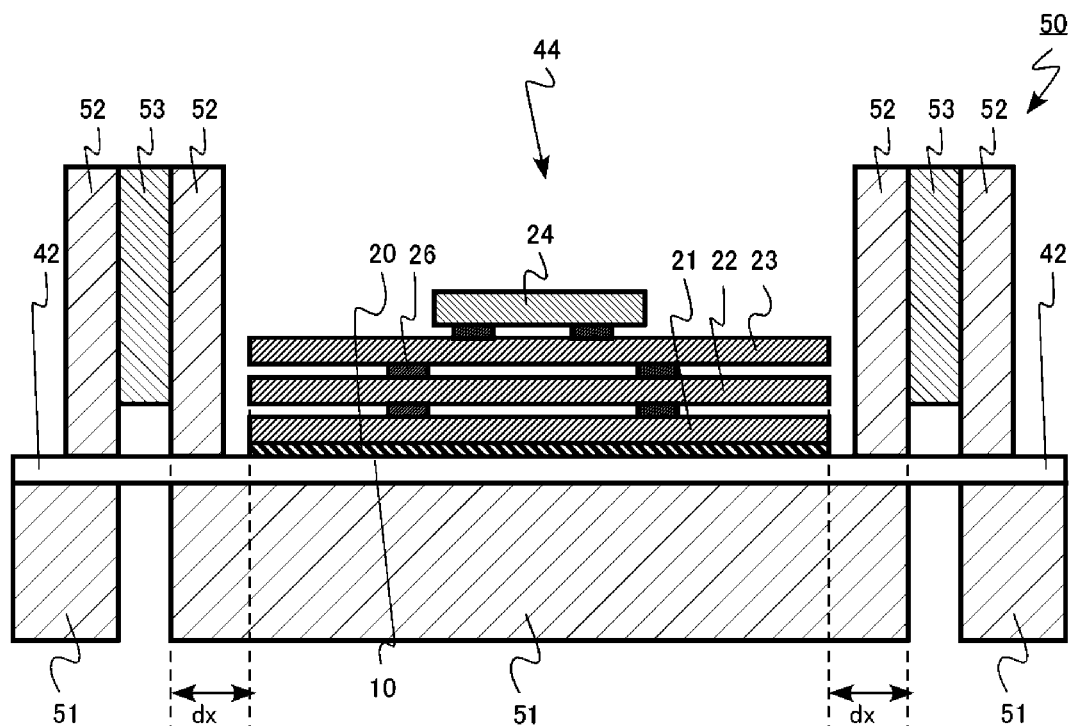
FIGS. 6A and 6B are views for explaining the method of manufacturing the semiconductor device of the first embodiment.
Figure 6B:
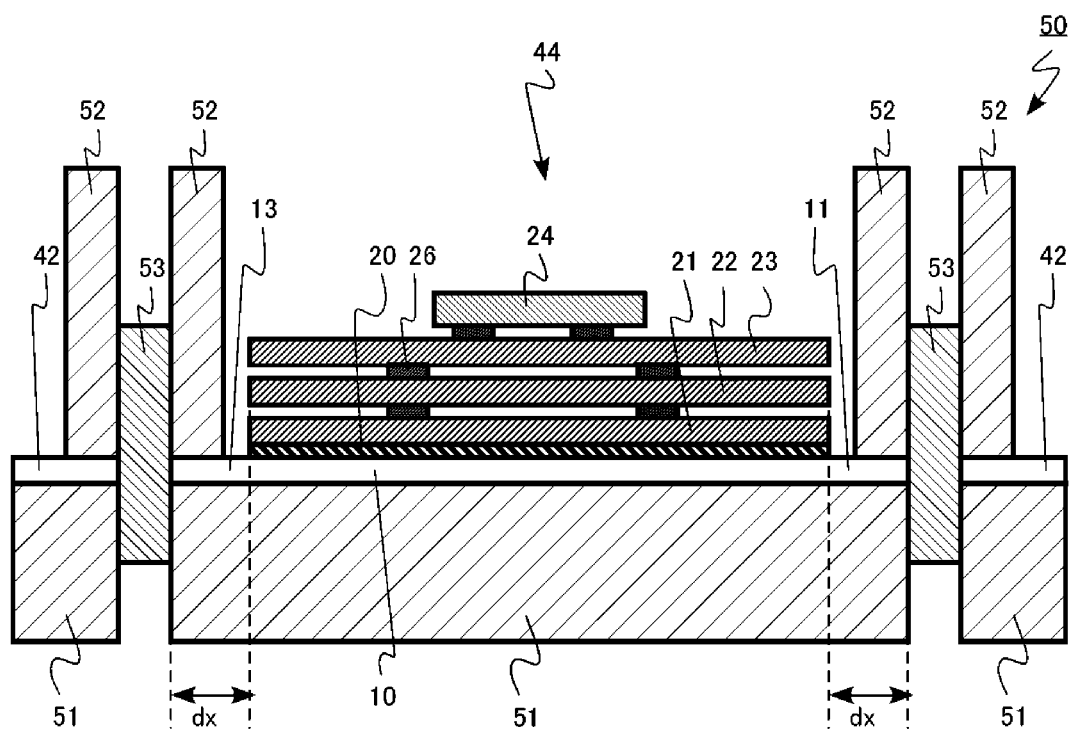

FIGS. 6A and 6B are views for explaining the method of manufacturing the semiconductor device of the first embodiment. FIGS. 6A and 6B are views for explaining a process of cutting the suspension pins 42. FIGS. 6A and 6B illustrate a method of cutting the suspension pins 42 using a cutting frame 50. FIG. 6A is a view illustrating a state before cutting, and FIG. 6B is a view illustrating a state after cutting. FIGS. 6A and 6B are cross-sectional views including the suspension pins 42.

The cutting frame 50 has supports 51, guides 52, and punches 53. As illustrated in FIG. 6A, the stacked body 44 formed on the lead frame is disposed on the supports 51 of the cutting frame 50. Upper surfaces of the suspensions pins 42 are pressed by the guides 52. The punches 53 for cutting the suspension pins 42 are provided between the guides 52.

As illustrated in FIG. 6B, the suspension pins 42 are processed by being cut through by the punches 53. The stacked body 44 is diced by cutting the suspension pins 42.

A predetermined distance, as a margin, is required between the guides 52 and each of the first memory chip 21, the second memory chip 22, and the third memory chip 23. In addition, a predetermined width is required at a tip end of each of the guides 52 in order to prevent damage to the suspension pins 42. Therefore, a predetermined distance is required as a distance (dx in FIGS. 6A and 6B) from the first memory chip 21, the second memory chip 22, and the third memory chip 23 to the positions where the suspension pins 42 are cut. The distance dx is, for example, 0.4 mm or more and 1.0 mm or less.

After the suspension pins 42 are cut, the first protruding portion 11 and the third protruding portion 13, which protrude from the end portions of the first memory chip 21, remain, as parts of the suspension pins 42, on the metal bed 10. The distance between the end portions of the first memory chip 21 and the tip ends of the first and third protruding portions 11 and 13 corresponds to the distance dx and is, for example, 0.4 mm or more and 1.0 mm or less.

Figure 7A:
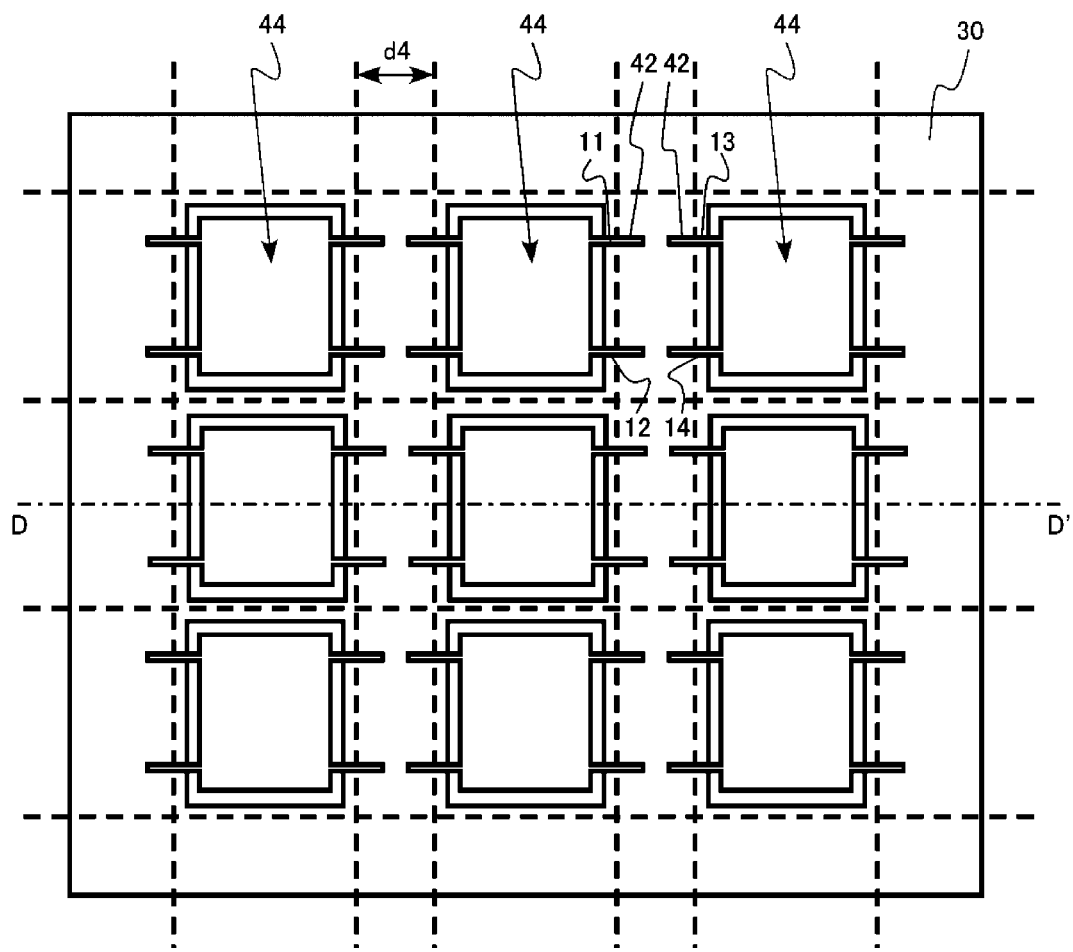
FIGS. 7A and 7B are schematic views illustrating the method of manufacturing the semiconductor device of the first embodiment.
Figure 7B:
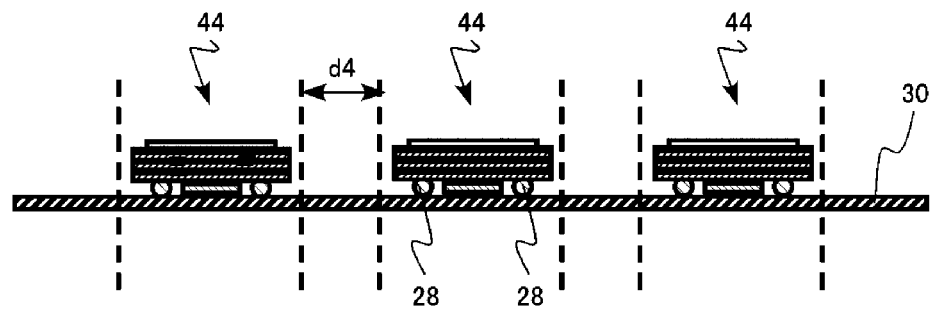
Figure 9A:
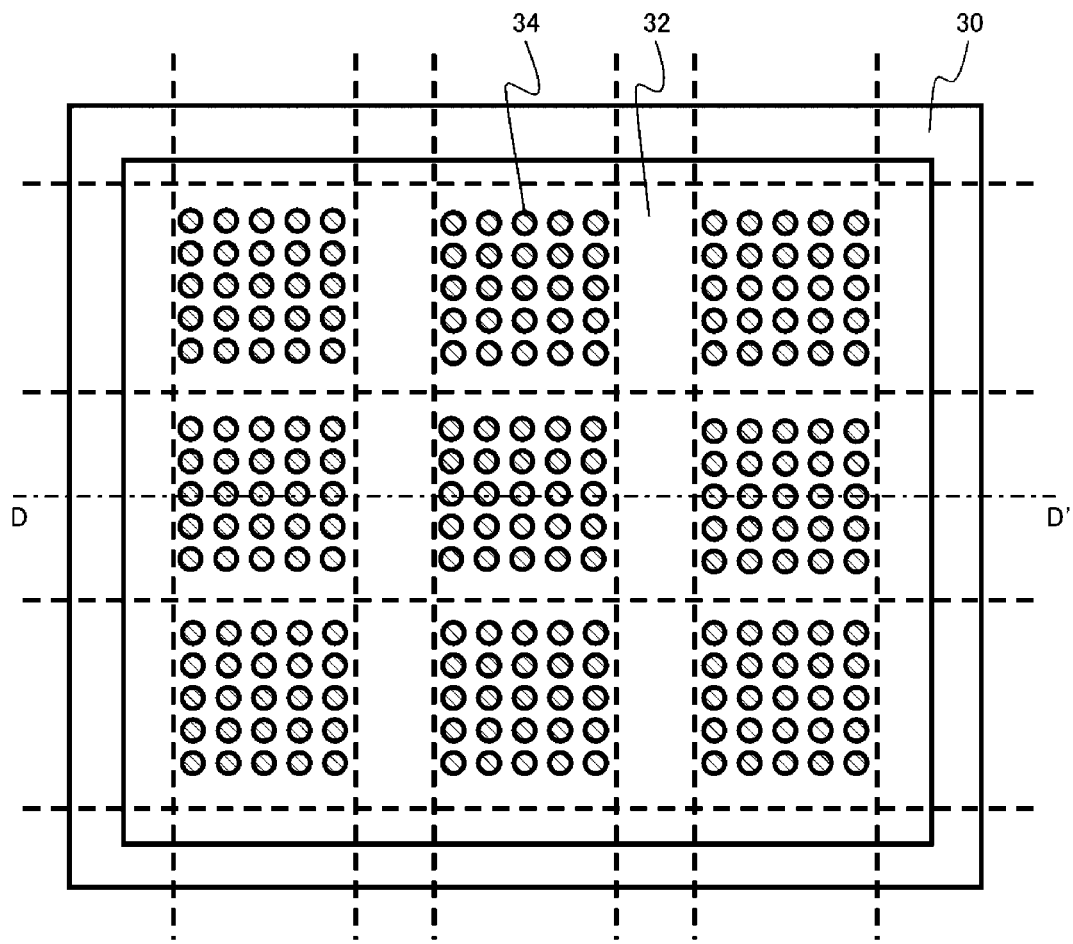
FIGS. 9A and 9B are schematic views illustrating the method of manufacturing the semiconductor device of the first embodiment.
Figure 9B:
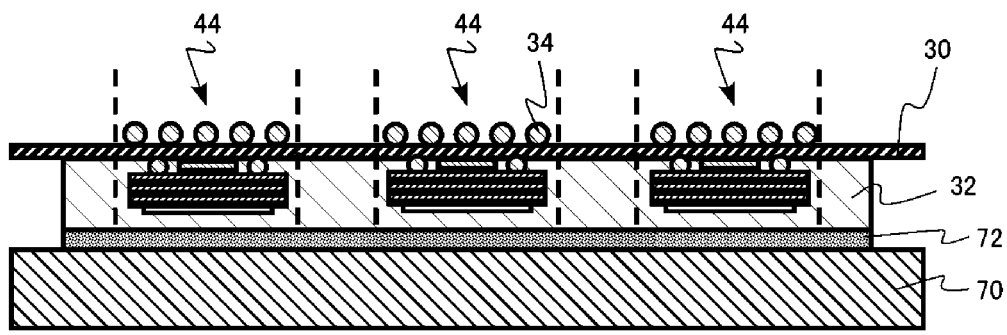

FIGS. 7A and 7B, FIGS. 8A and 8B, and FIGS. 9A and 9B are schematic views illustrating the method of manufacturing the semiconductor device of the first embodiment. FIGS. 7A, 8A, and 9A are top plan views. FIG. 7B is a cross-sectional view taken along line D-D' in FIG. 7A. FIG. 8B is a cross-sectional view taken along line D-D' in FIG. 8A. FIG. 9B is a cross-sectional view taken along line D-D' in FIG. 9A.

The multiple diced stacked bodies 44 are fixed onto the circuit board 30 (FIGS. 7A and 7B). The circuit board 30 and the stacked bodies 44 are connected to one another using, for example, the connecting terminals 28. The connecting terminals 28 are, for example, micro bumps. For example, nine stacked bodies 44 are fixed. The number of stacked bodies 44 fixed onto the circuit board 30 is not limited to nine.

The suspension pins 42, which correspond to the protruding portions of the metal beds 10 of the neighboring stacked bodies 44, are opposite each other. For example, as illustrated in FIGS. 7A and 7B, the suspension pins 42, which correspond to the first protruding portion 11 and the third protruding portion 13, are opposite each other. In addition, the suspension pins 42, which correspond to the second protruding portion 12 and the fourth protruding portion 14, are opposite each other.

Dotted lines in FIGS. 7A and 7B indicate predetermined cutting lines when cutting the circuit board 30. An ineffective region having a predetermined width (d4 in FIGS. 7A and 7B) is present on the circuit board 30 between neighboring two stacked bodies 44.

Next, the stacked bodies 44 are sealed with the mold resin 32 (FIGS. 8A and 8B). The mold resin 32 covers the metal beds 10, the first memory chips 21, the second memory chips 22, the third memory chips 23, and the logic chips 24. The mold resin 32 also fills portions between the semiconductor chips, that is, between the first memory chip 21 and the second memory chip 22, between the second memory chip 22 and the third memory chip 23, and between the third memory chip 23 and the logic chip 24.

For example, the mold resin 32 is introduced into the stacked bodies 44 in a direction indicated by white arrows illustrated in FIGS. 8A and 8B. That is, the mold resin 32 is introduced from a side of the metal beds 10 where no protruding portion is present. Since the mold resin 32 is introduced from the side where no protruding portion is present, the filling property of the mold resin 32 between the semiconductor chips is improved. That is, a cavity (void) is hardly formed in the mold resin 32 between the semiconductor chips.

Next, the external terminals 34 are formed on a surface of the circuit board 30 opposite from the stacked bodies 44. The external terminals 34 are, for example, solder balls.

Next, for example, the surface of the mold resin 32 above the metal beds 10 is bonded to a stage 70 of a dicing apparatus using an adhesion layer 72 (FIGS. 9A and 9B). Further, the stacked bodies 44 are diced by cutting the circuit board 30 and the mold resin 32 along predetermined cutting lines indicated by dotted lines in FIGS. 9A and 9B. In this case, a part of the protruding portions of the metal bed 10 is also cut. The circuit board 30, the mold resin 32, and the protruding portions of the metal beds 10 are cut using, for example, a blade type dicing apparatus.

The packaged semiconductor memory 100 is manufactured by the aforementioned manufacturing method.

Next, the operation and effects of the semiconductor device of the first embodiment will be described.

Figure 10:
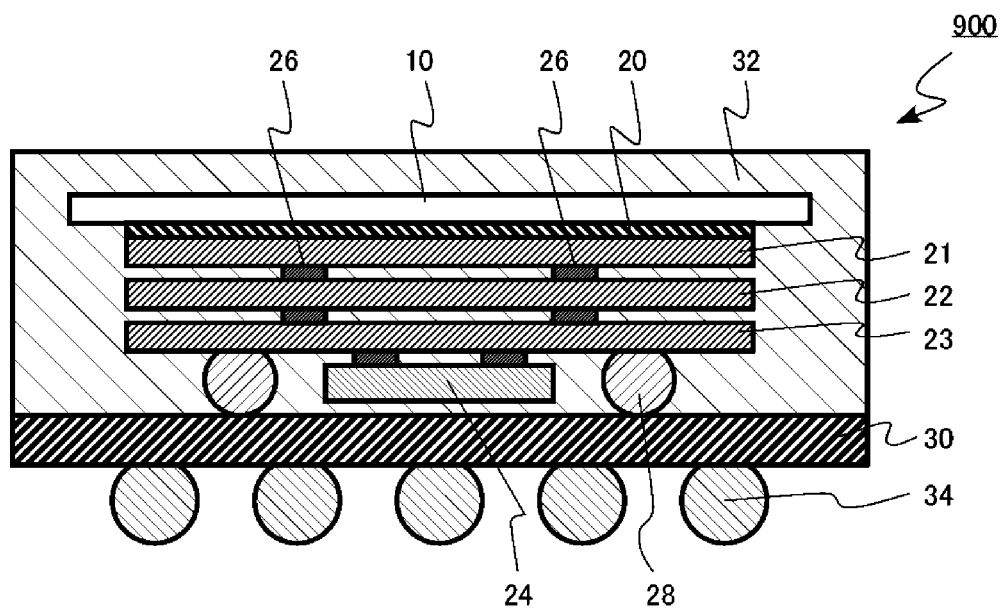
FIG. 10 is a schematic cross-sectional view of a semiconductor device of a comparative example.
Figure 11:
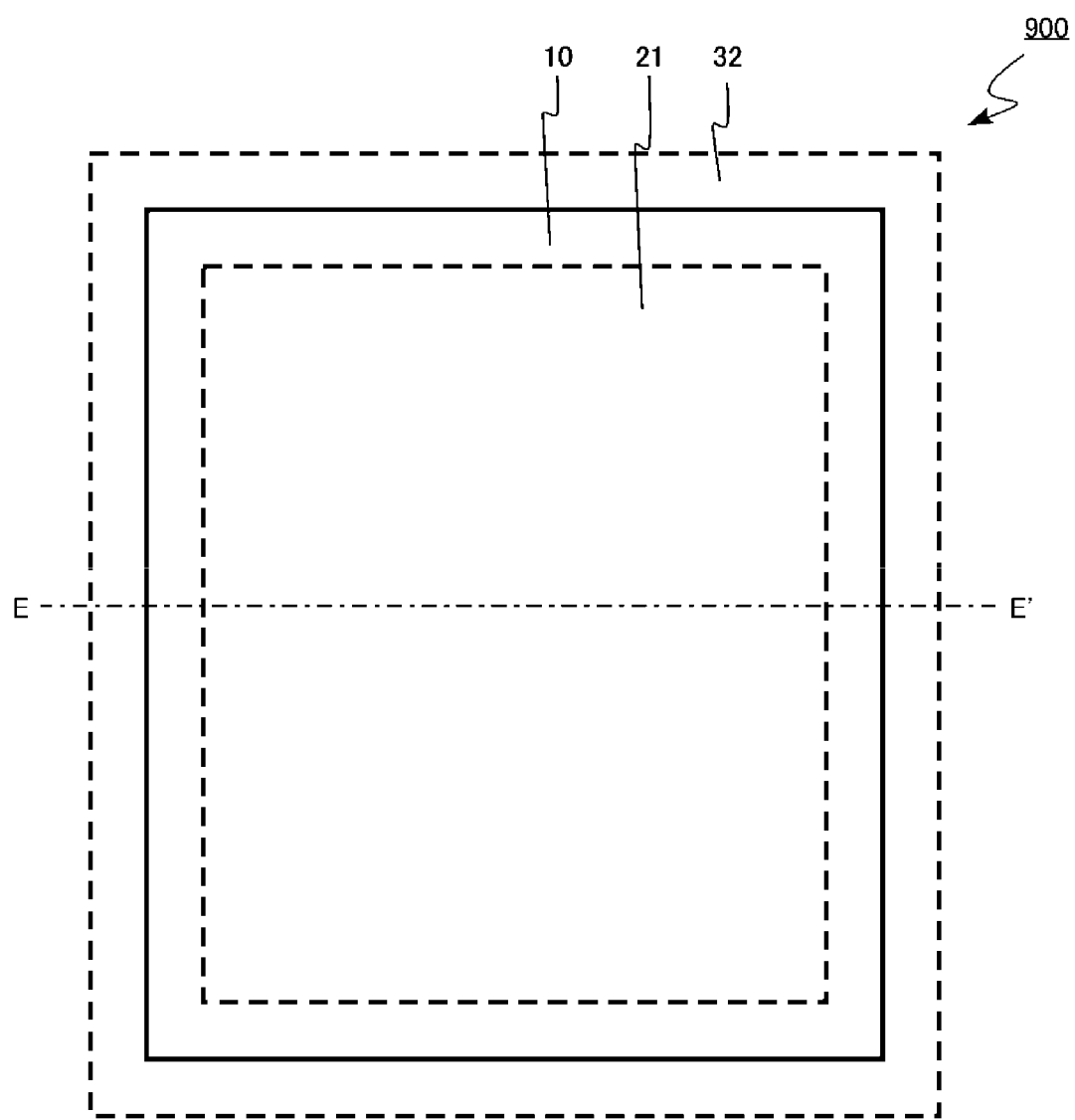
FIG. 11 is a schematic top plan view of the semiconductor device of the comparative example.
Figure 12:
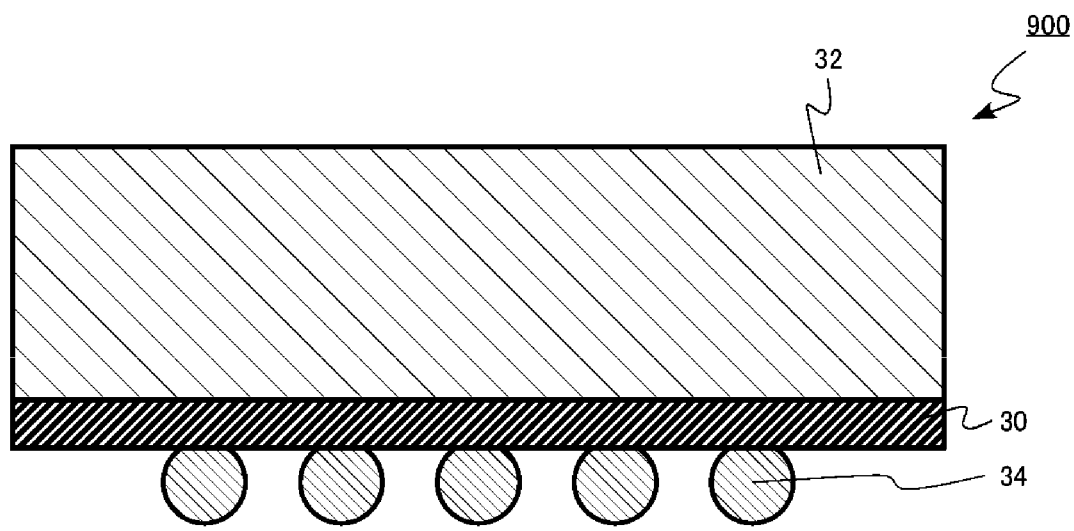
FIG. 12 is a schematic side view of the semiconductor device of the comparative example.

FIG. 10 is a schematic cross-sectional view of a semiconductor device of a comparative example. FIG. 11 is a schematic top plan view of the semiconductor device of the comparative example. FIG. 12 is a schematic side view of the semiconductor device of the comparative example. FIG. 10 is a cross-sectional view taken along line E-E' of FIG. 11. FIG. 11 is a view viewed through a mold resin.

The semiconductor device of the comparative example is a semiconductor memory 900. In the semiconductor memory 900, multiple memory chips and multiple logic chips are mounted in a single package.

The semiconductor memory 900 of the comparative example differs from the semiconductor memory 100 of the first embodiment in that the size of the metal bed 10 is larger than the size of the first memory chip 21.

No protruding portion is provided on the metal bed 10 of the semiconductor memory 900. This is due to the fact that it is possible to provide a position for cutting a lead frame in a connecting portion between each suspension pin 42 and the metal bed 10 or inward from the connecting portion during the process of cutting the suspension pins 42 because the metal bed 10 is sufficiently larger than the first memory chip 21. Therefore, unlike the semiconductor memory 100, the protruding portions of the metal bed 10 are not exposed to the side surface of the mold resin 32.

Figure 13A:
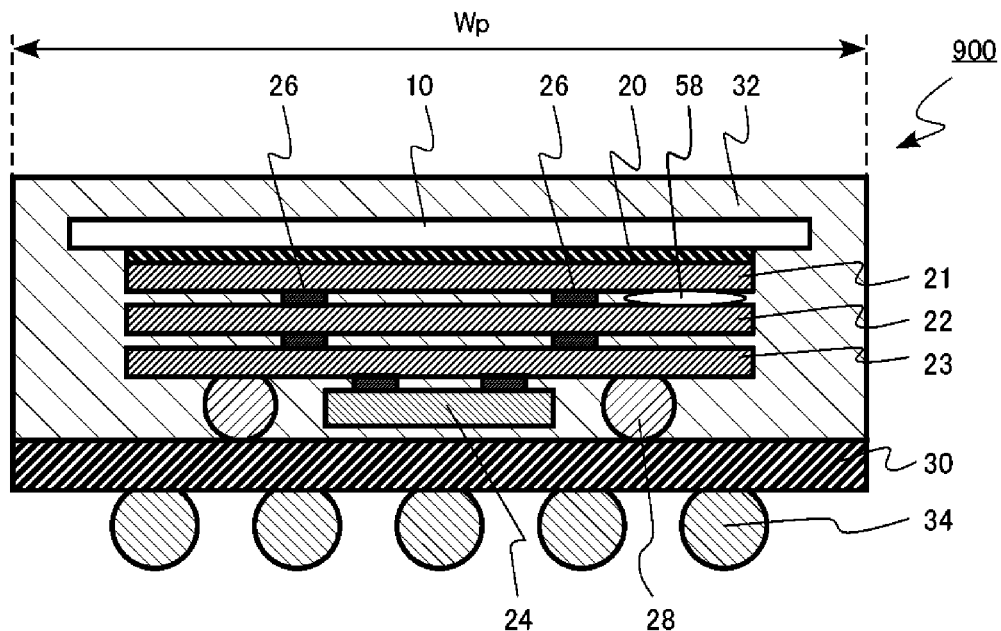
FIGS. 13A and 13B are views illustrating the operation and effects of the semiconductor device of the first embodiment.
Figure 13B:
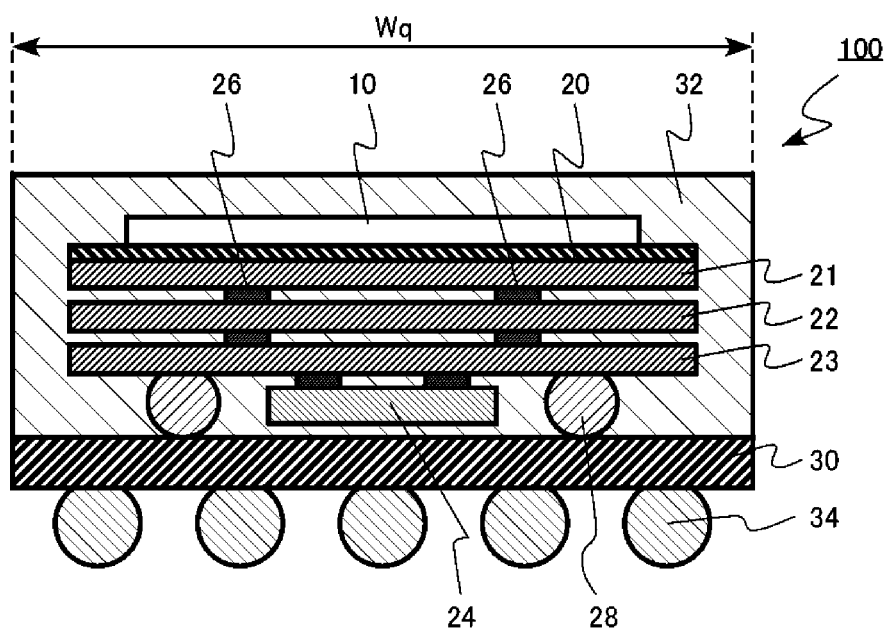

FIGS. 13A and 13B are views illustrating the operation and effects of the semiconductor device of the first embodiment. FIG. 13A is a schematic cross-sectional view of the semiconductor device of the comparative example. FIG. 13A illustrates the same cross section as FIG. 10. FIG. 13B is a schematic cross-sectional view of the semiconductor device of the first embodiment. FIG. 13B illustrates the same cross section as FIG. 1A.

In the semiconductor memory 100 of the first embodiment, the size of the metal bed 10 is smaller than the size of the first memory chip 21. For example, the width (Wq in FIG. 13B) of the semiconductor memory 100 is smaller than the width (Wp in FIG. 13A) of the semiconductor memory 900. Therefore, the semiconductor memory 100 may be miniaturized compared with the semiconductor memory 900 of the comparative example.

In the case of the semiconductor memory 900 of the comparative example, there is concern that the filling property of the mold resin 32 between the semiconductor chips deteriorates when sealing the semiconductor chips with the mold resin 32. In particular, there is concern that the filling property of the mold resin 32 between the first memory chip 21 and the second memory chip 22 deteriorates. For this reason, there is concern that a cavity (void) 58 is formed between the semiconductor chips as illustrated in FIG. 13A.

In the case of the semiconductor memory 900, the size of the metal bed 10 is larger than the size of the first memory chip 21. For this reason, when sealing the semiconductor chips with resin by introducing the mold resin 32, the metal bed 10 serves as a guard to inhibit the mold resin 32 from being introduced between the semiconductor chips. For this reason, the cavity 58 is formed between the semiconductor chips. When the cavity 58 is formed in the mold resin 32, there is a problem in that, for example, the reliability of the semiconductor memory 900 deteriorates.

In the semiconductor memory 100 of the first embodiment, the size of the metal bed 10 is smaller than the size of the first memory chip 21. For this reason, when introducing the mold resin 32 so as to seal the semiconductor chips with the resin, the metal bed 10 does not serve as a guard and does not inhibit the mold resin 32 from being introduced between the semiconductor chips.

Therefore, the filling property of the mold resin 32 between the semiconductor chips is improved in the semiconductor memory 100 of the first embodiment. Therefore, the reliability of the semiconductor memory 100 is improved.

In the semiconductor memory 100 of the first embodiment, the distance (d1 in FIG. 2) between the end portions of the metal bed 10 and the end portions of the first memory chip 21 may be 50 μm or more and 500 μm or less, particularly, 100 μm or more and 300 μm or less. When the distance falls below the aforementioned range, there is concern that the metal bed 10 will protrude outwardly from the end portion of the first memory chip 21 because of misalignment. In addition, when the difference exceeds the aforementioned range, the area of the first memory chip 21, which is not supported by the metal bed 10, is increased, and as a result, there is concern that the first memory chip 21 may be cracked.

For example, the first protruding portion 11 and the second protruding portion 12 may be provided on the third side 103 of the metal bed 10, and the third protruding portion 13 and the fourth protruding portion 14 may be provided on the fourth side 104 of the metal bed 10. In addition, for example, the first protruding portion 11, the second protruding portion 12, the third protruding portion 13, and the fourth protruding portion 14 may be provided at four corners of the metal bed 10, one for each corner, and the first protruding portion 11, the second protruding portion 12, the third protruding portion 13, and the fourth protruding portion 14 may extend while obliquely intersecting with the first direction and the second direction.

According to the semiconductor memory 100 of the first embodiment as described above, it is possible to miniaturize the semiconductor memory 100. In addition, it is possible to improve the reliability of the semiconductor memory 100.

Second Embodiment

A semiconductor device of a second embodiment differs from that of the first embodiment in that a line segment virtually connecting a first protruding portion and a third protruding portion, a line segment virtually connecting the first protruding portion and a fourth protruding portion, a line segment virtually connecting a second protruding portion and the third protruding portion, and a line segment virtually connecting the second protruding portion and the fourth protruding portion obliquely intersect with the second direction. Hereinafter, some descriptions in the contents overlapping with those of the first embodiment will be omitted.

FIG. 14 is a schematic top plan view of the semiconductor device of the second embodiment. FIG. 14 is a view viewed through the mold resin.

The semiconductor device of the second embodiment is a semiconductor memory 200. In the semiconductor memory 200, multiple memory chips and multiple logic chips are mounted in a single package.

A metal bed 10 has a first protruding portion 11, a second protruding portion 12, a third protruding portion 13, and a fourth protruding portion 14. The first protruding portion 11 and the second protruding portion 12 are provided on a first side 101 of the metal bed 10. The third protruding portion 13 and the fourth protruding portion 14 are provided on a second side 102 of the metal bed 10.

A line segment A virtually connecting the first protruding portion 11 and the third protruding portion 13, a line segment B virtually connecting the first protruding portion 11 and the fourth protruding portion 14, a line segment C virtually connecting the second protruding portion 12 and the third protruding portion 13, and a line segment D virtually connecting the second protruding portion 12 and the fourth protruding portion 14 obliquely intersect the second direction. The line segment A, the line segment B, the line segment C, and the line segment D are, for example, line segments that virtually connect the tip ends of the protruding portions.

The first and second protruding portions 11 and 12 are provided on the right side of the metal bed 10 and the third and fourth protruding portions 13 and 14 are provided on the left side of the metal bed 10 are disposed in a state in which the positions (positions in a vertical direction in FIG. 14) thereof are displaced in the first direction. In other words, the first and second protruding portions 11 and 12 provided on the right side of the metal bed 10 are closer together than are the third and fourth protruding portions 13 and 14 provided on the left side of the metal bed 10, and the protruding portions on either side are generally equally spaced from the center of the metal bed in the first direction.

As illustrated in FIGS. 7A and 7B, in the semiconductor memory 100 of the first embodiment, the protruding portions of the metal beds 10 of the neighboring stacked bodies 44 face each other and interfere with each other when the stacked bodies 44 are disposed on the circuit board 30. For example, as illustrated in FIGS. 7A and 7B, the first protruding portions 11 and the third protruding portions 13 face each other. In addition, the second protruding portions 12 and the fourth protruding portions 14 face each other.

The dotted lines in FIGS. 7A and 7B indicate the predetermined cutting lines when cutting the circuit board 30. The ineffective region having the predetermined width (d4 in FIGS. 7A and 7B) is present in the circuit board 30 between neighboring two stacked bodies 44. In the semiconductor memory 100 of the first embodiment, the protruding portions of the metal beds 10 correspond to each other in location and if placed too close together, interfere with each other, and as a result, the width d4 of the ineffective, i.e., waste, region is increased.

Figure 15A:
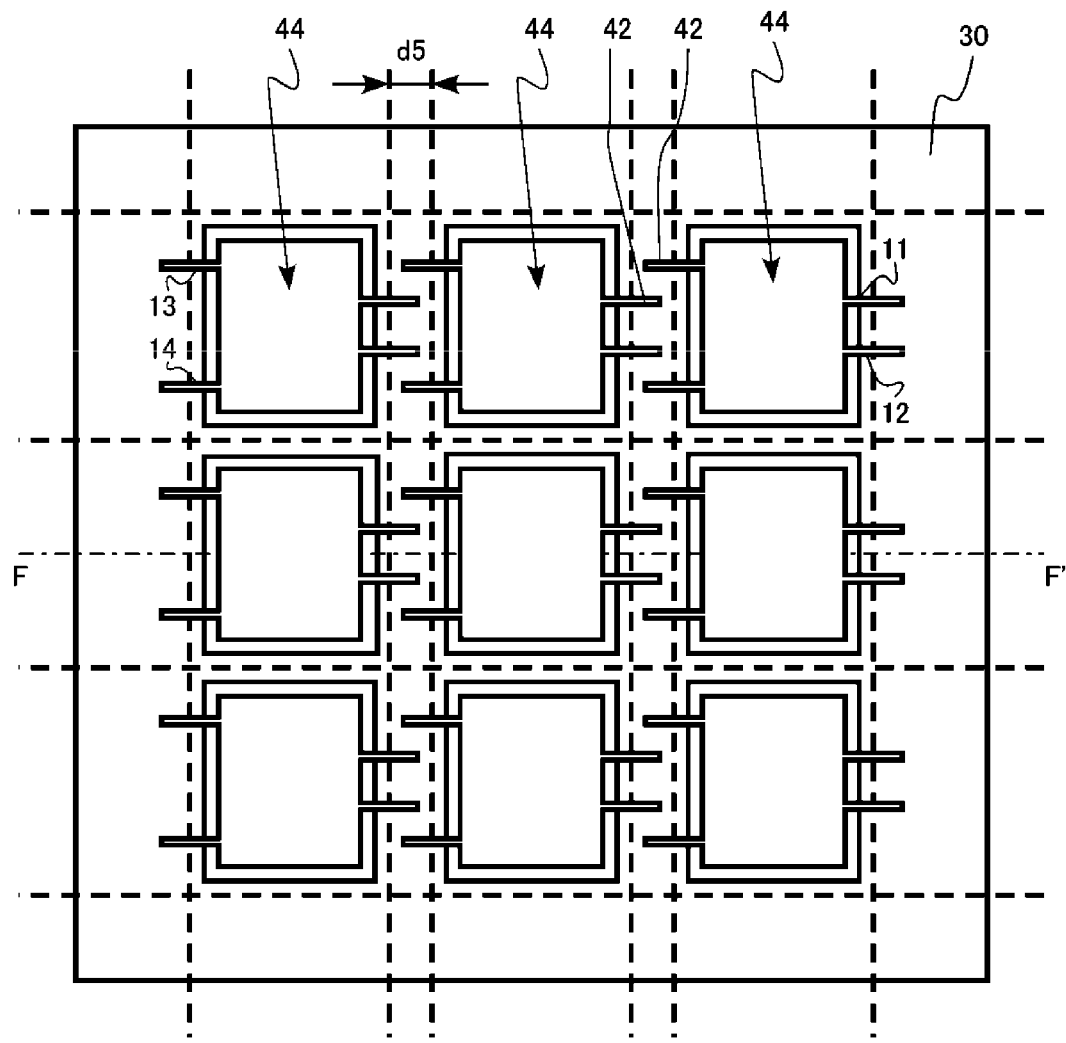
FIGS. 15A and 15B are schematic views illustrating a method of manufacturing the semiconductor device of the second embodiment.
Figure 15B:
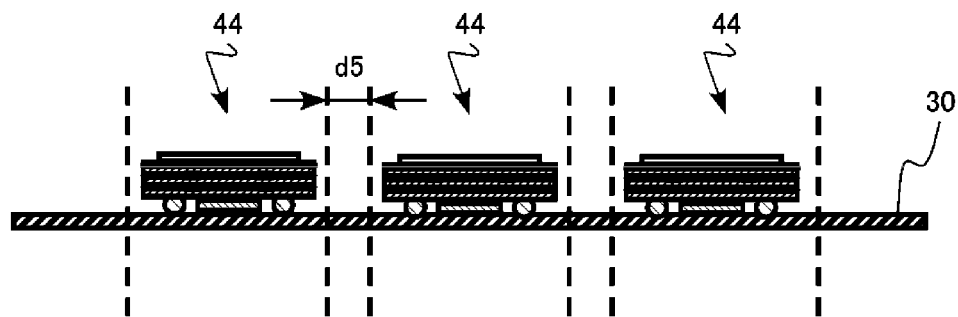

FIGS. 15A and 15B are schematic views illustrating a method of manufacturing the semiconductor device of the second embodiment. FIG. 15A is a top plan view. FIG. 15B is a cross-sectional view taken along line F-F' in FIG. 15A. FIGS. 15A and 15B are views corresponding to FIGS. 7A and 7B of the first embodiment.

In the semiconductor memory 200 of the second embodiment, the protruding portions of the metal bed 10 are disposed in a staggered relationship in relation to each other as illustrated in FIGS. 15A and 15B, and as a result, the suspension pins 42, which correspond to the protruding portions of the metal beds 10 of the neighboring stacked bodies 44, do not face each other and do not interfere with each other. Therefore, the distance between the metal beds 10 of the neighboring stacked bodies 44 may be decreased compared with the semiconductor memory 100. Therefore, the width (d5 in FIGS. 15A and 15B) of the ineffective region of the circuit board 30 is decreased compared with the semiconductor memory 100.

Since the width d5 of the ineffective region of the circuit board 30 is decreased, it is possible to reduce, for example, the size of the circuit board 30. In addition, for example, it is possible to mount more stacked bodies 44 on a circuit board 30 having the same size as compared with the circuit board of the first embodiment. Therefore, it is possible to reduce the manufacturing costs of the semiconductor memory 200.

The disposition of the protruding portions of the metal bed 10 is not limited to the disposition illustrated in FIG. 14. Any disposition other than the disposition illustrated in FIG. 14 is also available as long as the protruding portions of the metal bed 10 are disposed in a staggered relationship with respect to each other.

In the semiconductor memory 100 of the first embodiment, the size of the metal bed 10 is smaller than the size of the first memory chip 21 such that the protruding portions are provided on the metal bed 10. The semiconductor memory 200 of the second embodiment solves one of the problems caused by the protruding portions of the metal bed 10.

According to the semiconductor memory 200 of the second embodiment as described above, similar to the first embodiment, it is possible to miniaturize the semiconductor memory 200 and to improve the reliability thereof. Further, it is possible to reduce the manufacturing costs of the semiconductor memory 200.

Third Embodiment

A semiconductor device of a third embodiment differs from that of the first embodiment in that a first protruding portion has a first portion, and a second portion being closer to a tip end than the first portion and having a thickness smaller than the thickness of the first portion. Hereinafter, some descriptions in contents overlapping with those of the first embodiment will be omitted.

Figure 16:
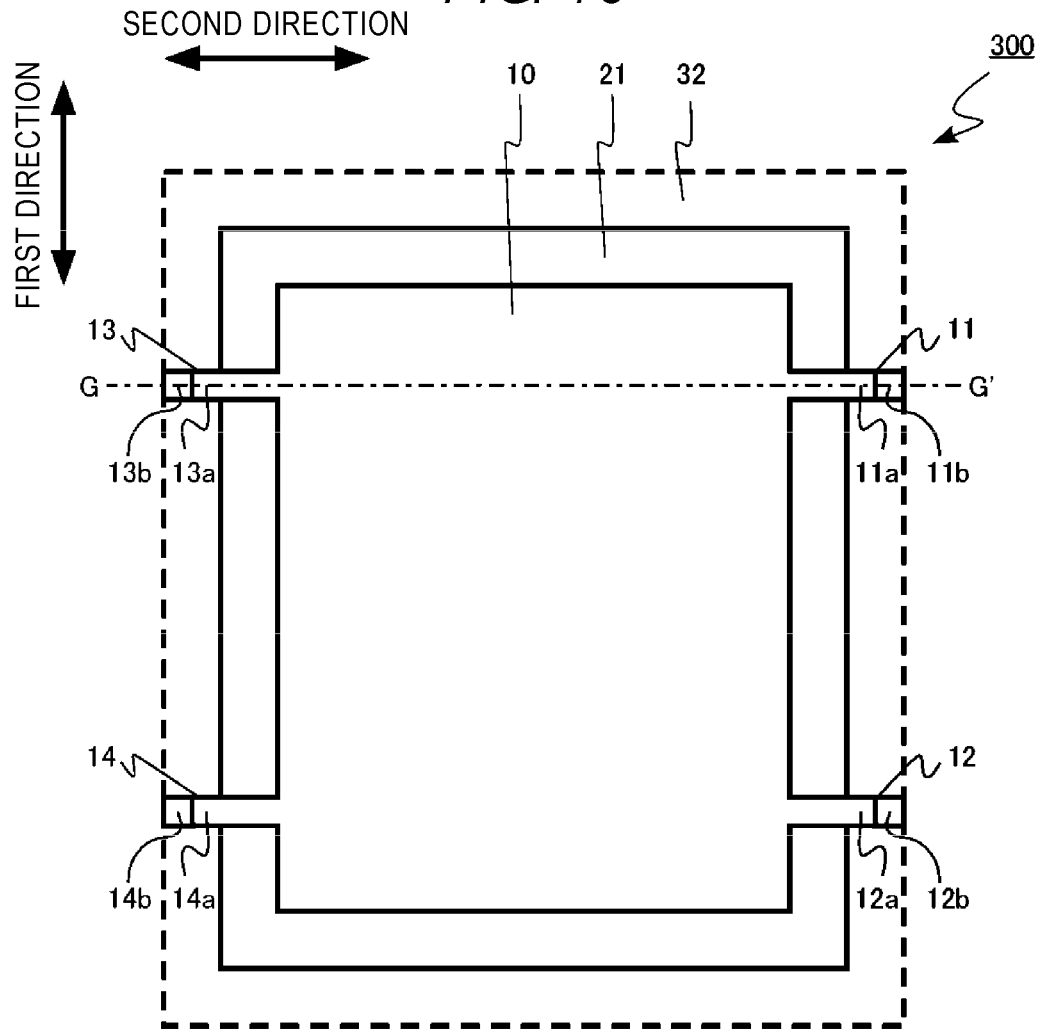
FIG. 16 is a schematic top plan view of a semiconductor device of a third embodiment.
Figure 17:
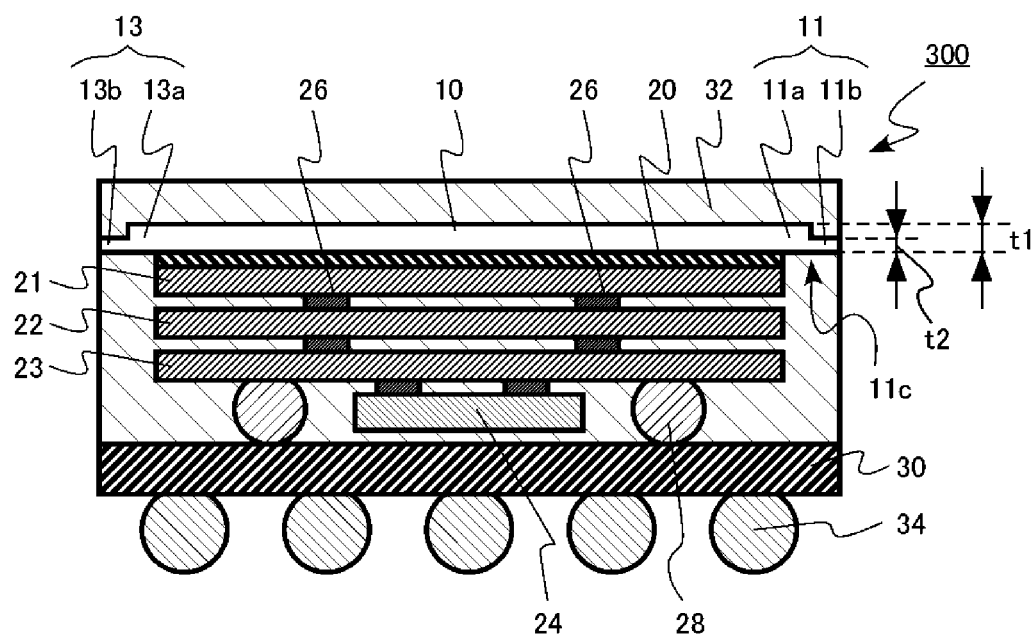
FIG. 17 is a schematic cross-sectional view of the semiconductor device of the third embodiment.

FIG. 16 is a schematic top plan view of the semiconductor device of the third embodiment. FIG. 17 is a schematic cross-sectional view of the semiconductor device of the third embodiment. FIG. 17 is a cross-sectional view taken along line G-G' of FIG. 16. FIG. 16 is a view viewed through mold resin.

The semiconductor device of the third embodiment is a semiconductor memory 300. In the semiconductor memory 300, multiple memory chips and multiple logic chips are mounted in a single package.

A metal bed 10 has a first protruding portion 11, a second protruding portion 12, a third protruding portion 13, and a fourth protruding portion 14. The first protruding portion 11 and the second protruding portion 12 are provided on a first side 101 of the metal bed 10. The third protruding portion 13 and the fourth protruding portion 14 are provided on a second side 102 of the metal bed 10.

The first protruding portion 11 has a first portion 11a and a second portion 11b. The second portion 11b is closer to the tip end of the first protruding portion 11 than is the first portion 11a. The thickness (t2 in FIG. 17) of the second portion 11b is smaller than the thickness (t1 in FIG. 17) of the first portion 11a.

A boundary 11c between the first portion 11a and the second portion 11b is located between an end portion of a first memory chip 21 and an end portion of a mold resin 32. A stepped portion at the boundary 11c between the first portion 11a and the second portion 11b is formed on a side of the metal bed 10 opposite the first memory chip 21.

The thickness t2 of the second portion 11b is, for example, one-third or more and two-third or less of the thickness t1 of the first portion 11a.

The second portion 11b is a part of a concave portion provided in the suspension pin of the lead frame. The second portion 11b is a concave portion of a suspension pin that is cut when cutting the circuit board 30 and the mold resin 32.

Similar to the configurations of the first portion 11a and the second portion 11b, the second protruding portion 12, the third protruding portion 13, and the fourth protruding portion 14 are also provided with first and second portions 12a and 12b, first and second portions 13a and 13b, and first and second portions 14a and 14b, respectively.

Figure 18A:
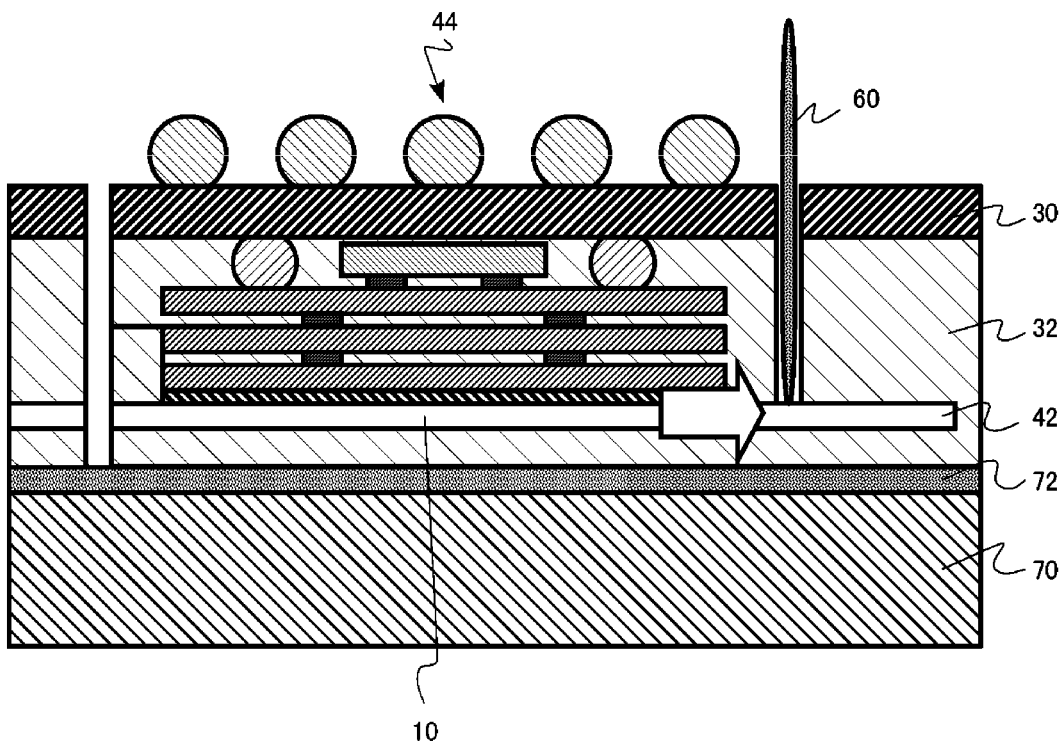
FIGS. 18A and 18B are views for explaining an operation and an effect of the semiconductor device of the third embodiment.
Figure 18B:
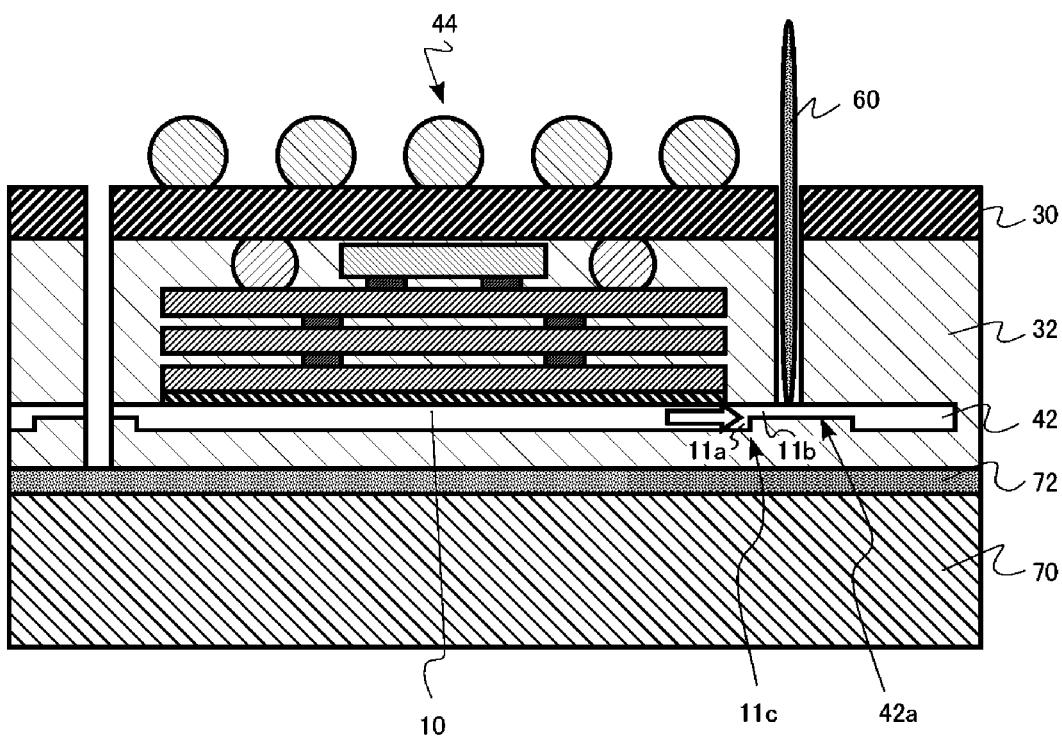

FIGS. 18A and 18B are views for explaining the operation and effects of the semiconductor device of the third embodiment. FIG. 18A is a cross-sectional view of the first embodiment, and FIG. 18B is a cross-sectional view of the third embodiment.

FIGS. 18A and 18B illustrate a cross section when cutting the circuit board 30 and the mold resin 32 using a blade dicing apparatus. FIGS. 18A and 18B illustrate a cross section while the suspension pins 42 of the lead frame are being cut.

The mold resin 32 of the stacked body 44 is bonded to a stage 70 of the dicing apparatus using an adhesion layer 72. The circuit board 30, the mold resin 32, and the suspension pin 42 are cut by a rotating dicing blade 60. The left side of the stacked body 44 is already cut. The right side of the stacked body 44 is being cut.

For example, in the first embodiment illustrated in FIG. 18A, the suspension pin 42 is pulled in a direction indicated by the white arrow by the action of the dicing blade when cutting the suspension pin 42 by using the dicing blade 60. As the suspension pin 42 is pulled, the suspension pin 42 is moved in the direction indicated by the white arrow relative to the mold resin 32. For this reason, there is concern that the suspension pin 42 and the mold resin 32 become separated from each other.

When the suspension pin 42 and the mold resin 32 are separated from each other, the separation point becomes a path through which the moisture penetrates into the chip package from the outside. When the moisture penetrates, there is concern that short-circuit occurs in the semiconductor memory 100. Therefore, there is concern that the reliability of the semiconductor memory 100 deteriorates.

The greater the thickness of the suspension pin 42 to be cut by the dicing blade 60, the longer the time required to cut the suspension pin 42. For this reason, the time required to pull the suspension pin 42 is increased, and as a result, separation between the suspension pin 42 and the mold resin 32 easily occurs.

When the thickness of the mold resin 32 at a portion between the cutting portion of the suspension pin 42 and the adhesion layer 72 is small, the mold resin 32 tends to become insufficient. If a lack of the mold resin 32 occurs, the semiconductor memory 100 has a defective external appearance.

In the third embodiment illustrated in FIG. 18B, a concave portion 42a, which becomes the second portion 11b of the first protruding portion 11 after cutting, is provided in the suspension pin 42. Even though the suspension pin 42 is pulled in the direction indicated by the white arrow by the action of the dicing blade when cutting the suspension pin 42 using the dicing blade 60, the stepped portion at the boundary 11c between the first portion 11a and the second portion 11b is caught by the mold resin 32. For this reason, the movement of the suspension pin 42 relative to the mold resin 32 is inhibited.

Therefore, the separation between the suspension pin 42 and the mold resin 32 is inhibited. Therefore, the reliability of the semiconductor memory 300 is improved in comparison with the first embodiment.

The thickness of the suspension pin 42 is small in the concave portion 42a of the suspension pin 42. Therefore, time required to cut the suspension pin 42 is decreased. Therefore, the occurrence of the separation between the suspension pin 42 and the mold resin 32 is further inhibited.

The thickness of the mold resin 32 in the portion between the cutting portion of the suspension pin 42 and the adhesion layer 72 is increased since the concave portion 44a of the suspension pin 42 is provided. Therefore, the mold resin 32 is inhibited from becoming insufficient. Therefore, the occurrence of the defective external appearance of the semiconductor memory 300 is inhibited.

The thickness t2 of the second portion 11b may be one-third or more and two-third or less of the thickness t1 of the first portion 11a. In a case in which the ratio falls below the aforementioned range, there is concern that strength of the suspension pin 42 is insufficient. In a case in which the ratio exceeds the aforementioned range, there is concern that the separation between the suspension pin 42 and the mold resin 32 is insufficiently inhibited. In addition, in a case in which the range exceeds the aforementioned range, there is concern that the effect of inhibiting the mold resin 32 from becoming insufficient is insufficient.

In the semiconductor memory 100 of the first embodiment, the size of the metal bed 10 is smaller than the size of the first memory chip 21 such that the protruding portions are provided on the metal bed 10. Further, the protruding portions are exposed from the mold resin 32. The semiconductor memory 300 of the third embodiment solves one of the problems caused by the protruding portions of the metal bed 10.

It is possible to configure a semiconductor memory by combining the configuration of the second embodiment and the configuration of the third embodiment.

According to the semiconductor memory 300 of the third embodiment as described above, similar to the first embodiment, it is possible to miniaturize the semiconductor memory 300, and to improve the reliability thereof. Further, it is possible to improve the reliability of the semiconductor memory 300, and to inhibit the occurrence of the defective external appearance thereof.

Fourth Embodiment

A semiconductor device of a fourth embodiment differs from that of the first embodiment in that a first protruding portion has a first region which has a tapered shape the width of which is decreased toward the tip end, and a second region which is closer to the tip than the first region and has a nearly uniform width. Hereinafter, some descriptions in the contents overlapping with those of the first embodiment will be omitted.

FIG. 19 is a schematic top plan view of a semiconductor device of a fourth embodiment. FIG. 19 is a view viewed through mold resin.

The semiconductor device of the fourth embodiment is a semiconductor memory 400. In the semiconductor memory 400, multiple memory chips and multiple logic chips are mounted in a single package.

A metal bed 10 has a first protruding portion 11, a second protruding portion 12, a third protruding portion 13, and a fourth protruding portion 14. The first protruding portion 11 and the second protruding portion 12 are provided at a first side 101 of the metal bed 10. The third protruding portion 13 and the fourth protruding portion 14 are provided at a second side 102 of the metal bed 10.

The first protruding portion 11 has a first region 11x and a second region 11y. The second region 11y is closer to the tip end of the first protruding portion 11 than the first region 11x. The first region 11x has a tapered shape of which the width is decreased toward the tip end of the first protruding portion 11. The second region 11y has a nearly uniform width.

A boundary 11z between the first region 11x and the second region 11y is located, for example, between an end portion of the first memory chip 21 and an end portion of the mold resin 32.

Similar to the configurations of the first region 11x and the second region 11y, the second protruding portion 12, the third protruding portion 13, and the fourth protruding portion 14 are also provided with first and second regions 12x and 12y, first and second regions 13x and 13y, and first and second regions 14x and 14y, respectively.

Even though the suspension pin 42 is pulled in the direction indicated by the white arrow when cutting the suspension pin 42 using the dicing blade 60, the first region 11x having the tapered shape is caught by the mold resin 32. For this reason, the movement of the suspension pin 42 relative to the mold resin 32 is inhibited.

Therefore, the separation between the suspension pin 42 and the mold resin 32 is inhibited. Therefore, the reliability of the semiconductor memory 400 is improved in comparison with the first embodiment.

The first protruding portion 11 may not have the second region 11y, but the entire first protruding portion 11 may have a tapered shape.

In the semiconductor memory 100 of the first embodiment, the size of the metal bed 10 is smaller than the size of the first memory chip 21 such that the protruding portions are provided on the metal bed 10. Further, the protruding portions are exposed from the mold resin 32. The semiconductor memory 400 of the fourth embodiment solves one of the problems caused by the protruding portions of the metal bed 10.

It is possible to configure a semiconductor memory by combining the configuration of the second embodiment and the configuration of the fourth embodiment. Further, it is possible to configure a semiconductor memory by combining the configuration of the second embodiment, the configuration of the third embodiment, and the configuration of the fourth embodiment.

According to the semiconductor memory 400 of the fourth embodiment as described above, it is possible to miniaturize the semiconductor memory 400, and to improve the reliability thereof as in the first embodiment. In addition, it is possible to improve the reliability of the semiconductor memory 400.

In the first to fourth embodiments, the semiconductor memory in which the memory chips and the logic chips are stacked has been described as an example of the semiconductor device. However, the semiconductor device is not limited to the above-described configuration. For example, a semiconductor memory in which only memory chips are stacked is also available. In addition, for example, a logic device in which only logic chips are stacked is also available.

In the first to fourth embodiments, an example in which three memory chips are stacked has been described, but the number of stacked memory chips may be two or four or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a metal plate having a main portion having a first width in a first direction and a second width in a second direction orthogonal to the first direction;
   a first semiconductor chip located between the metal plate and the substrate, the first semiconductor chip having a third width in the first direction and a fourth width in the second direction;
   a second semiconductor chip located between the first semiconductor chip and the substrate; and
   a resin material extending over the main portion of the metal plate, wherein
   the first width is smaller than the third width, and the second width is smaller than the fourth width,
   the resin material extends over the first semiconductor chip and the second semiconductor chip, the resin material including a side surface,
   the metal plate includes a first protruding portion, a second protruding portion, a third protruding portion, and a fourth protruding portion, each protruding from the main portion of the metal plate, and
   a surface of the first protruding portion, a surface of the second protruding portion, a surface of the third protruding portion, and a surface of the fourth protruding portion are exposed at the side surface of the resin material.

2. The semiconductor device according to claim 1, wherein
   the main portion of the metal plate includes a first side and a second side disposed in parallel with each other in the first direction, and the second side is on an opposite side of the main portion of the metal plate from the first side and a third side and a fourth side which are parallel with each other in the second direction, the third side being on an opposite side of the main portion of the metal plate from the fourth side, and
   the first protruding portion and the second protruding portion extend from the first side of the main portion, and the third protruding portion and the fourth protruding portion extend from the second side of the main portion.

3. The semiconductor device according to claim 2, wherein a line segment virtually connecting the first protruding portion and the third protruding portion, a line segment virtually connecting the first protruding portion and the fourth protruding portion, a line segment virtually connecting the second protruding portion and the third protruding portion, and a line segment virtually connecting the second protruding portion and the fourth protruding portion obliquely intersect with the second direction.

4. The semiconductor device according to claim 2, wherein
the first and second protruding portions extend from the first side of the main portion equidistant from the center of the main portion in the first direction by a first distance, and
the second and third protruding portions extend from the second side of the main portion equidistant from the center of the main portion in the first direction by a second distance, different than the first distance.

5. The semiconductor device according to claim 4, wherein the second distance is greater than the first distance.

6. The semiconductor device according to claim 1, wherein the first protruding portion includes a tip end, a first portion, and a second portion closer to the tip end than the first portion and having a thickness smaller than the thickness of the first portion.

7. The semiconductor device according to claim 1, wherein the first protruding portion includes a tip end and a first region having a tapered shape, the width of which decreases from the metal plate side to the tip end side of the protruding portion.

8. The semiconductor device according to claim 7, wherein the first protruding portion has a second region closer to the tip end than the first region, and has a substantially uniform width.

9. The semiconductor device according to claim 1, further comprising:
a resin layer located between the metal plate and the first semiconductor chip.

10. The semiconductor device according to claim 1, wherein the substrate is a circuit board.

11. A semiconductor device, comprising:
a mounting bed having a mounting surface, opposed first and second sides on opposite sides of the mounting bed, and opposed third and fourth sides on opposite sides of the mounting bed, the mounting surface having a first surface area;
a first semiconductor chip having a mounting surface facing the mounting surface of the mounting bed, wherein the surface area of the mounting surface of the first semiconductor chip is greater than the surface area of the mounting surface of the mounting bed and the sides of the semiconductor chip extend outwardly of the four sides of the mounting bed;
a first projecting portion extending from the first side of the bed and outwardly of the mounting surface of the first semiconductor chip;
a second projecting portion extending from the first side of the bed and outwardly of the mounting surfaces of the first semiconductor chip; and
a resin extending over the mounting bed and the first semiconductor chip, wherein
the first and second sides extend in a first direction, and the first and second projecting portions extend from the mounting surface of the mounting bed in a second direction generally orthogonal to the first direction and end in a tip end, and
the tip ends of the first and second projecting portions are not covered by the resin.

12. The semiconductor device according to claim 11, further comprising:
a substrate, wherein the first semiconductor chip is located between the substrate and the mounting bed.

13. The semiconductor device according to claim 12, further comprising:
a second semiconductor chip disposed between the substrate and the first semiconductor chip, wherein
one of the first and second semiconductor chips is a memory chip.

14. The semiconductor device according to claim 13, further comprising:
a resin layer located between the mounting bed and the first semiconductor chip.

15. The semiconductor device according to claim 11, wherein
the first and second sides of the mounting bed have a center location, and
the first and second projecting portions extend from a location of the first and second sides equidistant from the center locations.

16. The semiconductor device according to claim 11, wherein
the first and second sides of the mounting bed have a center location, and
the first and second projecting portions extend from locations on the first and second sides at different distances from the center locations.

17. The semiconductor device of claim 11, wherein
at least one of the first and second projecting portions include a first portion extending from one of the first and second sides, a tip end, and a second portion extending from the first portion to the tip end, and
the second portion is thinner than the thickness of the first portion.

18. The semiconductor device according to claim 11, wherein
at least one of the first and second projecting portions include a first portion extending from one of the first and second sides, a tip end, and a second portion extending from the first portion to the tip end, and
the first portion tapers from a first width to a second width smaller than the width of the first portion and equal to the width of the second portion.

* * * * *